(12) United States Patent
Kim et al.

(10) Patent No.: US 12,490,389 B2
(45) Date of Patent: Dec. 2, 2025

(54) DISPLAY DEVICE

(71) Applicants: Samsung Display Co., Ltd., Yongin-si (KR); Industry-Academic Cooperation Foundation, Yonsei University, Seoul (KR)

(72) Inventors: Taewoong Kim, Yongin-si (KR); Jong Hyun Ahn, Seoul (KR); Boik Park, Yongin-si (KR); Beom Jin Kim, Seoul (KR); Heechang Shin, Seoul (KR)

(73) Assignees: SAMSUNG DISPLAY CO., LTD., Gyeonggi-Do (KR); INDUSTRY-ACADEMIC COOPERATION FOUNDATION, YONSEI UNIVERSITY, Seoul (KR)

(*) Notice: Subject to any disclaimer, the term of this patent is extended or adjusted under 35 U.S.C. 154(b) by 239 days.

(21) Appl. No.: 18/238,552

(22) Filed: Aug. 28, 2023

(65) Prior Publication Data
US 2024/0206086 A1   Jun. 20, 2024

(30) Foreign Application Priority Data

Dec. 16, 2022 (KR) .......................... 10-2022-0177217

(51) Int. Cl.
*G09F 9/30* (2006.01)
*H05K 5/02* (2006.01)

(52) U.S. Cl.
CPC ...................................... *H05K 5/02* (2013.01)

(58) Field of Classification Search
None
See application file for complete search history.

(56) References Cited

U.S. PATENT DOCUMENTS

| | | | |
|---|---|---|---|
| 10,217,950 B2 | 2/2019 | Joo et al. | |
| 10,826,004 B2 | 11/2020 | Zhai | |
| 11,256,295 B2 | 2/2022 | Lee et al. | |
| 2010/0330338 A1 | 12/2010 | Boyce et al. | |
| 2018/0061743 A1 | 3/2018 | Hsu et al. | |
| 2019/0011954 A1* | 1/2019 | Chu | B32B 17/06 |
| 2019/0047900 A1* | 2/2019 | Hu | C03C 17/28 |
| 2020/0287156 A1* | 9/2020 | Baby | H10K 59/871 |

(Continued)

FOREIGN PATENT DOCUMENTS

| | | | |
|---|---|---|---|
| KR | 101966787 B1 | 4/2019 | |
| KR | 102279067 B1 | 7/2021 | |

(Continued)

OTHER PUBLICATIONS

Korner, C et al. A systematic approach to identify cellular auxetic materials, Smart Materials and Structures, 24, 025013 10 Pages (2015).

*Primary Examiner* — Xanthia C Relford
(74) *Attorney, Agent, or Firm* — CANTOR COLBURN LLP

(57) ABSTRACT

A display device includes a display panel, a first auxetic structure including a first pattern that defines a plurality of first openings, overlapping the display panel, and having a negative Poisson's ratio, a second auxetic structure including a second pattern that defines a plurality of second openings, overlapping the first auxetic structure, and having a negative Poisson's ratio, and a support layer disposed below the display panel and supporting the display panel.

21 Claims, 29 Drawing Sheets

(56) References Cited

U.S. PATENT DOCUMENTS

| | | | |
|---|---|---|---|
| 2021/0090476 A1* | 3/2021 | Kang | ................. G09F 9/301 |
| 2021/0233447 A1 | 7/2021 | Park | |
| 2022/0162060 A1* | 5/2022 | Chung | ............... B81C 1/00134 |
| 2022/0384769 A1 | 12/2022 | Baek et al. | |
| 2024/0206086 A1* | 6/2024 | Kim | ................. H04M 1/02 |

FOREIGN PATENT DOCUMENTS

| | | |
|---|---|---|
| KR | 1020210096725 A | 8/2021 |
| KR | 102363908 B1 | 2/2022 |
| KR | 1020220027895 A | 3/2022 |
| KR | 1020220065146 A | 5/2022 |
| KR | 1020220159525 A | 12/2022 |

\* cited by examiner

DISPLAY DEVICE

This application claims priority to Korean Patent Application No. 10-2022-0177217, filed on Dec. 16, 2022, and all the benefits accruing therefrom under 35 U.S.C. § 119, the content of which in its entirety is herein incorporated by reference.

BACKGROUND

1. Field

The disclosure herein relates to a display device, and more particularly, to a flexible display device and a rollable display device.

2. Description of the Related Art

Electronic devices such as smartphones, tablets, laptop computers, car navigation systems, and smart televisions are being developed. These electronic devices are provided with display devices for providing information.

Various types of display devices are being developed to satisfy the UX/UI of users. Particularly, flexible and rollable display devices are being actively developed.

SUMMARY

The disclosure provides a display device having improved impact resistance and improved surface quality after rolling and folding.

An embodiment of the inventive concept provides a display device including a display panel, a first auxetic structure including a first pattern that defines a plurality of first openings, overlapping the display panel, and having a negative Poisson's ratio, a second auxetic structure including a second pattern that defines a plurality of second openings, overlapping the first auxetic structure, and having a negative Poisson's ratio, and a support layer disposed below the display panel and supporting the display panel.

In an embodiment, the display device may further include an adhesive layer disposed between the first auxetic structure and the second auxetic structure to bond the first auxetic structure and the second auxetic structure, wherein the adhesive layer may have a smaller modulus than a modulus of the first auxetic structure and the second auxetic structure.

In an embodiment, the display panel may provide a display surface defined by a first direction and a second direction, and in a first mode of the display device, the display surface may provide a flat surface, and in a second mode of the display device, at least a portion of the display surface may provide a curved surface with respect to a reference axis.

In an embodiment, the support layer may include a plurality of support sticks parallel to the reference axis, and in the first mode, the plurality of support sticks may be arranged along a direction crossing the reference axis.

In an embodiment, the first auxetic structure and the second auxetic structure may each have a Poisson's ratio of equal to or greater than about −0.9 and equal to or less than about −0.1.

In an embodiment, the first pattern may overlap the second pattern, and the first pattern and the second pattern may be identical to each other.

In an embodiment, when the first pattern and the second pattern overlap, an opening ratio of a planar pattern defined by the first pattern and the second pattern may be equal to or greater than about 10% and equal to or less than about 60%.

In an embodiment, the first pattern may overlap the second pattern, and the second pattern may be a pattern in which the first pattern is rotated equal to or greater than about 45 degrees and equal to or less than about 180 degrees in a plan view.

In an embodiment, the first auxetic structure may have a thickness of equal to or greater than about 10 micrometers (μm) to equal to or less than about 500 μm, and the second auxetic structure may have a thickness of equal to or greater than about 10 μm and equal to or less than about 500 μm.

In an embodiment, the first auxetic structure and the second auxetic structure may each be disposed between the display panel and the support layer.

In an embodiment, the display device may further include a digitizer disposed below the display panel, wherein the first auxetic structure and the second auxetic structure may each be disposed below the display panel, and may include a non-magnetic material which is not responsive to a magnetic field.

In an embodiment, the first auxetic structure and the second auxetic structure may each be disposed on an upper surface of the display panel.

In an embodiment, the first auxetic structure and the second auxetic structure may each include a material having a light transmittance of equal to or greater than about 90%.

In an embodiment, the display device may further include an optical adhesive layer, wherein the first auxetic structure and the second auxetic structure may be impregnated into the optical adhesive layer.

In an embodiment, a refractive index of the optical adhesive layer, a refractive index of the first auxetic structure, and a refractive index of the second auxetic structure may be substantially identical to each other.

In an embodiment, the display device may further include a display panel protection layer disposed on a lower surface of the display panel and having a modulus of equal to or greater than about 1 gigapascal (Gpa) and equal to or less than about 10 Gpa.

In an embodiment, the display device may further include an elastic layer disposed on the support layer or disposed on the display panel and including an elastomer.

In an embodiment of the inventive concept, a display device includes a display panel, a plurality of stress control layers overlapping the display panel, and a support layer disposed below the plurality of stress control layers and supporting the display panel, wherein the plurality of stress control layers include a first stress control layer disposed on an upper surface of the display panel and a second stress control layer disposed on a lower surface of the display panel, the first stress control layer and the second stress control layer each include a first auxetic structure including a first pattern that defines a plurality of first openings and having a negative Poisson's ratio, and a second auxetic structure overlapping the first auxetic structure, including a second pattern that defines a plurality of second openings, and having a negative Poisson's ratio.

In an embodiment, the first auxetic structure and the second auxetic structure may each have a Poisson's ratio of equal to or greater than about −0.9 and equal to or less than about −0.1.

In an embodiment, the first stress control layer may include a material having a light transmittance of equal to or greater than about 90%, and the second stress control layer may include a non-magnetic material which is not responsive to a magnetic field.

In an embodiment, the first pattern may overlap the plurality of second openings in a plan view and the second pattern may overlap the plurality of first openings in the plan view, and when the first pattern and the second pattern overlap, a planar opening ratio of an entirety of the first and second auxetic structure may be equal to or greater than about 10% and equal to or less than about 60%.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
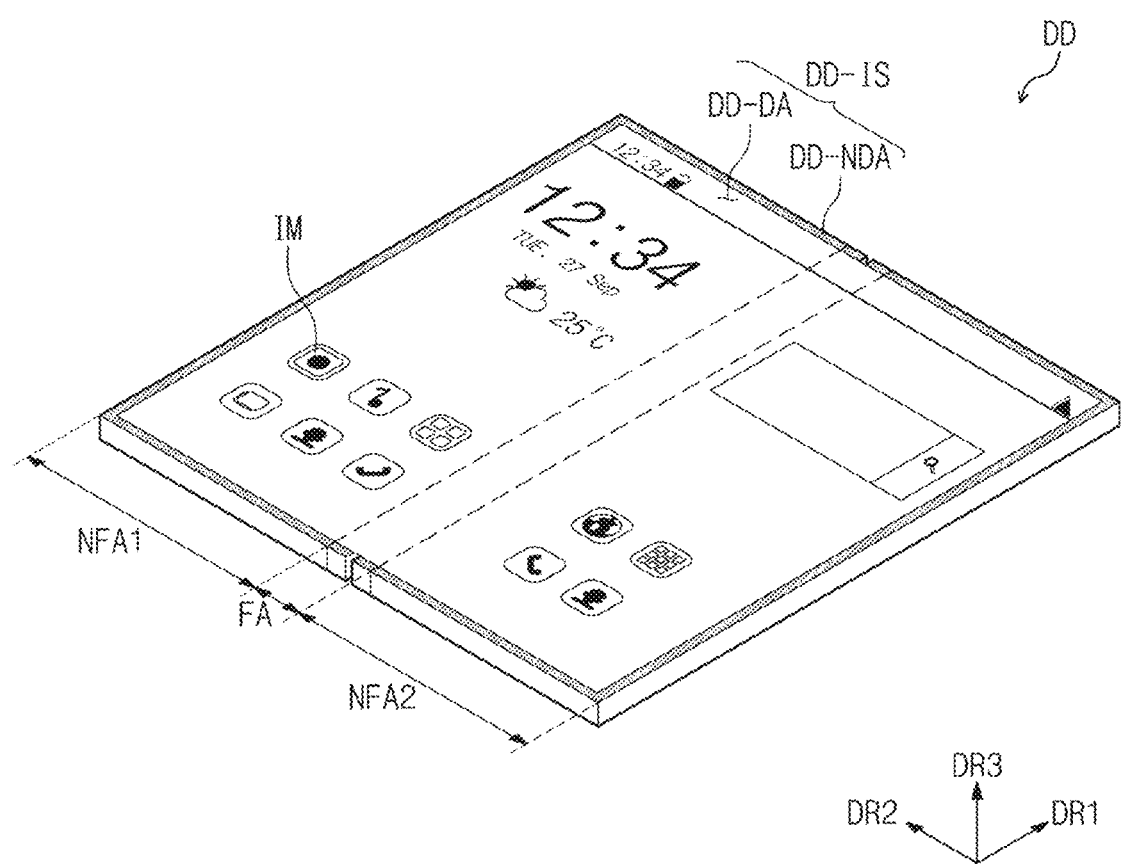
FIGS. 1A and 1B are perspective views of an embodiment of a display device according to the inventive concept.

In the description, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. In addition, in the drawings, the thickness, the ratio, and the dimensions of elements are exaggerated for an effective description of technical contents. The term "and/or," includes all combinations of one or more of which associated configurations may define.

It will be understood that, although the terms "first", "second", and the like may be used herein to describe various elements, these elements should not be limited by these terms. These terms are only used to distinguish one element from another. For example, a first element could be termed a second element, and, similarly, a second element could be termed a first element, without departing from the scope of embodiments of the inventive concept. The terms of a singular form may include plural forms unless the context clearly indicates otherwise.

In addition, terms such as "below," "lower," "on," "upper," and the like are used to describe the relationship of the configurations shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the disclosure pertains. It is also to be understood that terms defined in commonly used dictionaries should be interpreted as having meanings consistent with the meanings in the context of the related art, and are expressly defined herein unless they are interpreted in an ideal or overly formal sense. In addition, terms, such as those defined in commonly used dictionaries, should be interpreted as having a meaning that is consistent with their meaning in the context of the relevant art and should not be interpreted in an idealized or overly formal sense unless expressly so defined herein.

Hereinafter, embodiments of the inventive concept will be described with reference to the accompanying drawings.

Figure 1B:
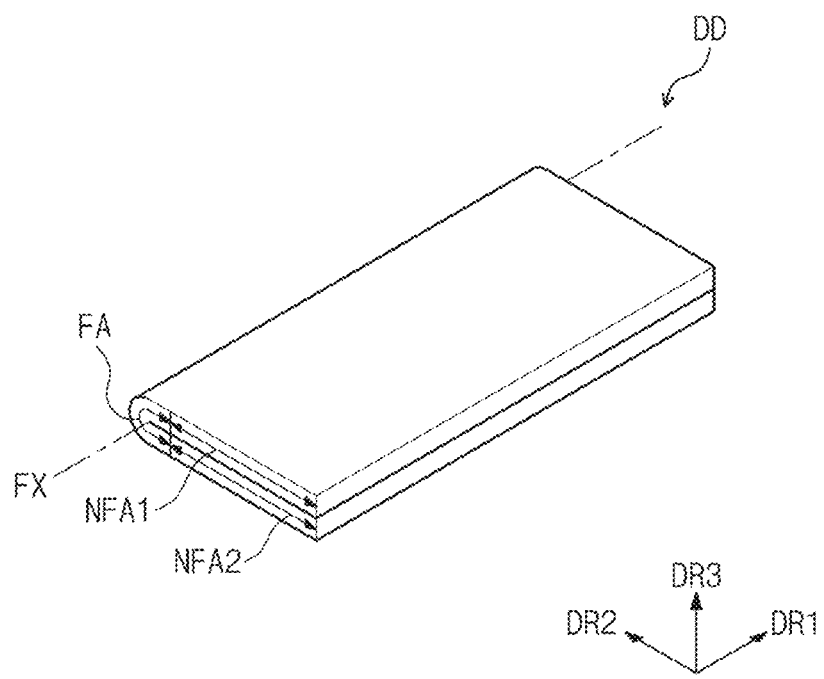
Figure 2A:
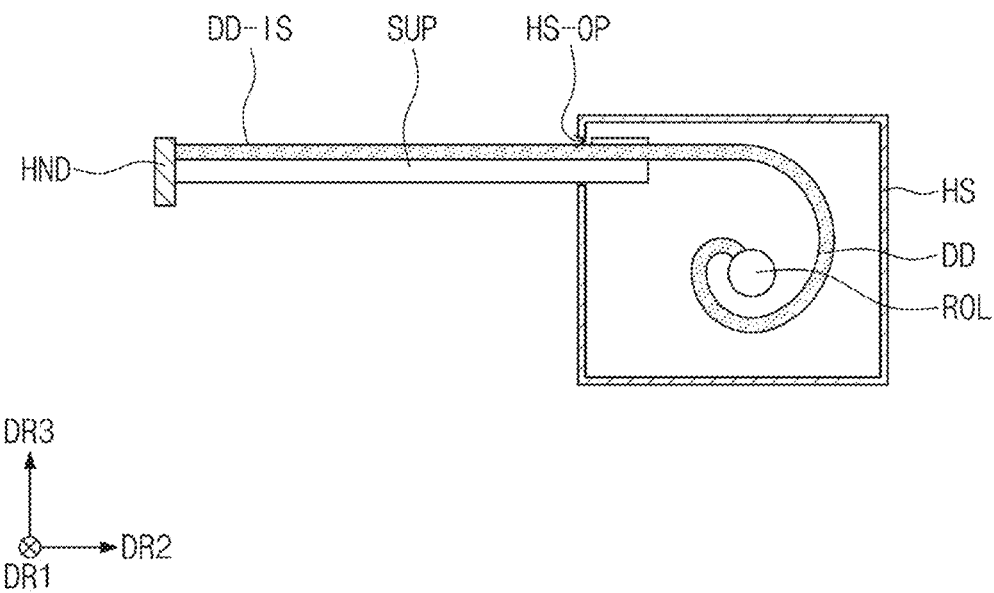
FIGS. 2A and 2B are perspective views of an embodiment of a display device according to the inventive concept.
Figure 2B:
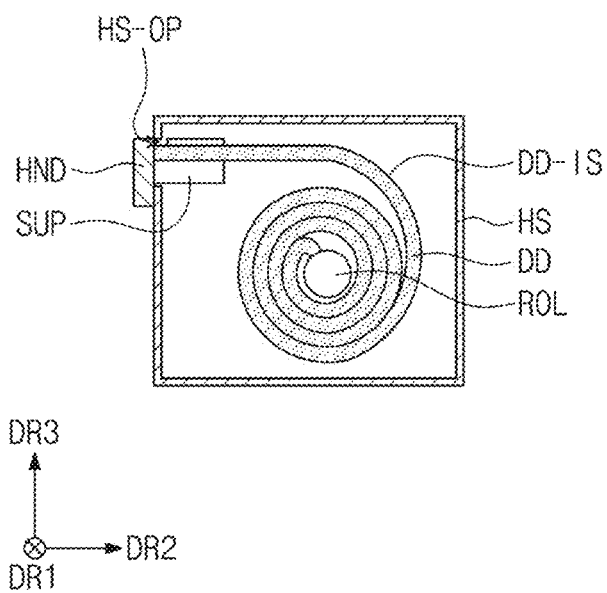

FIGS. 1A and 1B are perspective views of an embodiment of a display device DD according to the inventive concept. FIGS. 2A and 2B are perspective views of an embodiment of a display device DD according to the inventive concept.

FIGS. 1A and 1B show a foldable display device DD in an embodiment of a flexible display device, and FIGS. 2A and 2B show a rollable display device DD in an embodiment of a flexible display device. However, the inventive concept is not limited thereto, and may be applied to other display devices such as a slidable display device.

FIG. 1A shows an unfolded state (first mode) of the foldable display device DD. A display surface DD-IS is parallel to a plane defined by a first direction DR1 and a second direction DR2. A normal direction of the display surface DD-IS, that is, a thickness direction of the display device DD, is indicated by a third direction DR3. A front surface (or an upper surface) and a rear surface (or a lower surface) of respective members are defined with respect to the third direction DR3. Hereinafter, first to third directions correspond to directions indicated by the first to third directional axes DR1, DR2, and DR3, respectively, and are given the same reference numerals.

As shown in FIG. 1A, the display surface DD-IS includes a display region DD-DA in which an image IM is displayed, and a non-display region DD-NDA disposed adjacent to the display region DD-DA. The non-display region DD-NDA is a region on which images are not displayed. In FIG. 1A, icon images are shown in an embodiment of the image IM. In an embodiment, the display region DD-DA may have a quadrangular shape, for example. The non-display region DD-NDA may surround the display region DD-DA. However, the inventive concept is not limited thereto, and the shape of the display region DD-DA and the shape of the non-display region DD-NDA may be modified.

FIG. 1B shows a folded state (second mode) of the foldable display device DD. As shown in FIG. 1B, the display device DD may include a plurality of regions defined according to operation modes. The display device DD may include a folding region FA that is folded with respect to a folding axis FX, a first plane region NFA1 disposed adjacent to the folding region FA, and a second plane region NFA2. In the illustrated embodiment, the folding axis FX may be parallel to the first direction DR1. The folding region FA is a region substantially forming a curvature. The folding region FA provides a curved display surface DD-IS in a second mode. The folding axis FX may be a reference axis of the folding region FA.

In the illustrated embodiment, a display device DD in which the folding axis FX parallel to a major axis of the display device DD is defined is shown as an example. However, the inventive concept is not limited thereto, and the folding axis FX may be parallel to a minor axis of the display device DD.

As shown in FIGS. 1A and 1B, the display device DD may be inner-folded or inner-bent such that the display surface DD-IS of the first plane region NFA1 faces the display surface DD-IS of the second plane region NFA2. In an embodiment of the inventive concept, the display device DD may be outer-folded or outer-bent such that the display surface DD-IS is exposed to the outside.

In an embodiment of the inventive concept, the display device DD may include a plurality of folding regions FA. In addition, the folding region FA may be defined to correspond to a mode in which users operate the display device DD. In an embodiment, the folding region FA may be defined in a diagonal direction crossing the first direction DR1 and the second direction DR2 when viewed in a plan view, for example. An area of the folding region FA is not determined and may vary according to a radius of curvature.

In an embodiment of the inventive concept, the display devices DD may be configured such that an inner-folding operation or an outer-folding operation is mutually repeated from an unfolding operation, but the inventive concept is not limited thereto. In an embodiment of the inventive concept, the display devices DD may select any one of an unfolding operation, an inner-folding operation, or an outer-folding operation.

Referring to FIGS. 2A and 2B, a rollable display device DD may enter and exit a housing HS through a storage opening HS-OP. One end of the rollable display device DD may be connected to a handle HND. The rollable display device DD may be guided by a support portion SUP. The support portion SUP may include an assembly of support frames that are withdrawn step by step during the unfolding operation. A roller ROL has a shape extending in the first direction DR1 and may rotate with respect to a rolling axis. The rolling axis may be a reference axis of a rolled display device DD.

FIG. 2A shows an unfolded state (first mode) of the rollable display device DD. FIG. 2B shows a rolled state (first mode) of the foldable display device DD. When the display device DD is unfolded in the first mode, at least a portion of the display device DD exposed from the housing HS may provide a flat display surface DD-IS. In the first mode or the second mode, at least a portion of the display device DD disposed in the housing HS substantially forms a curvature. The curved portion of the display device DD provides a curved display surface DD-IS. In an embodiment of the inventive concept, a stress control layer which will be described later may overlap at least a region providing a curved display surface of the display device DD. In an embodiment, the stress control layer may be disposed at least in the folding region FA of the foldable display device DD, for example. In an embodiment, the stress control layer may be disposed in an entirety of the region of the rollable display device DD, for example. The stress control layer is disposed in the region providing the curved display surface, and accordingly, stress on mechanical deformation such as repetitive folding or rolling of a display device may be reduced.

Figure 3:
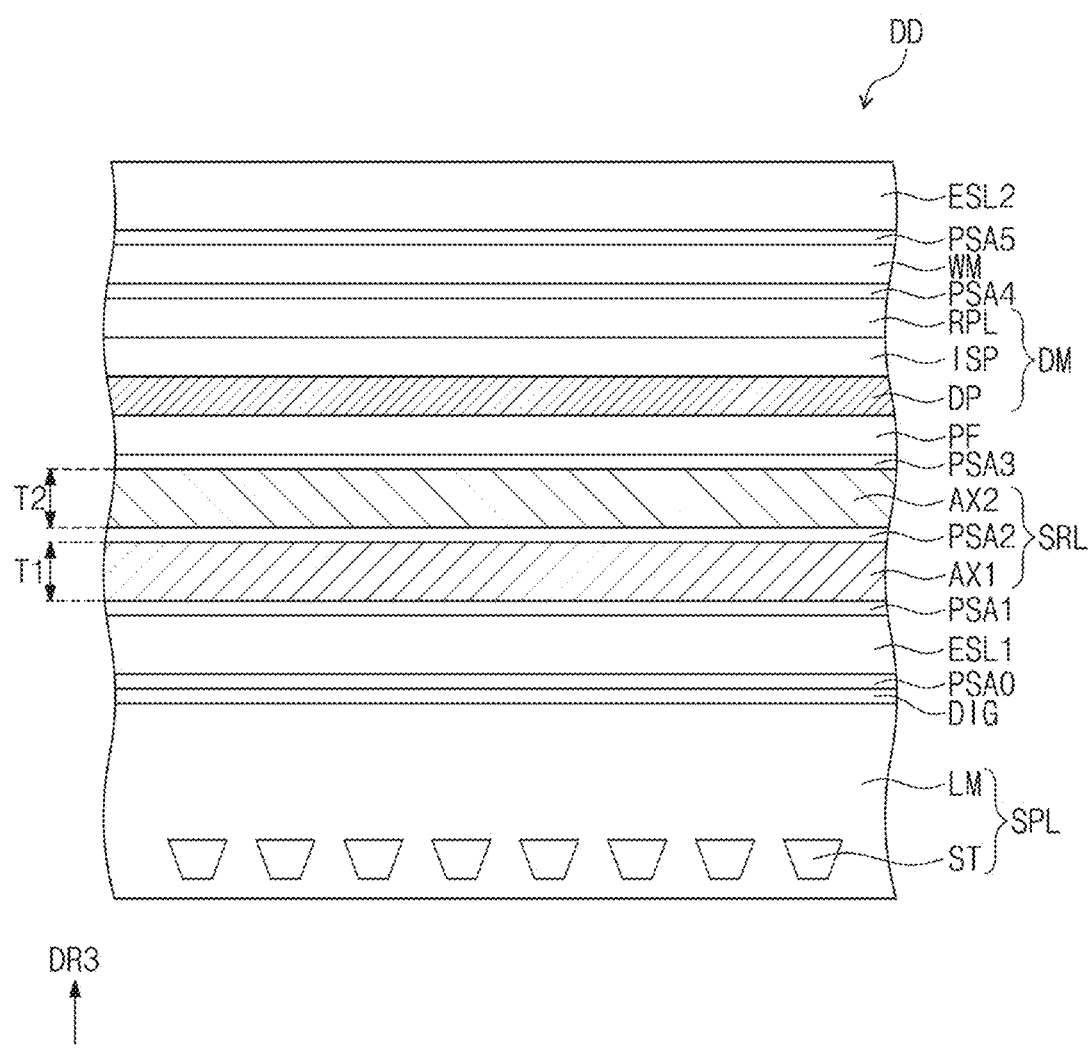
FIG. 3 is a cross-sectional view of an embodiment of a display device according to the inventive concept.
Figure 4A:
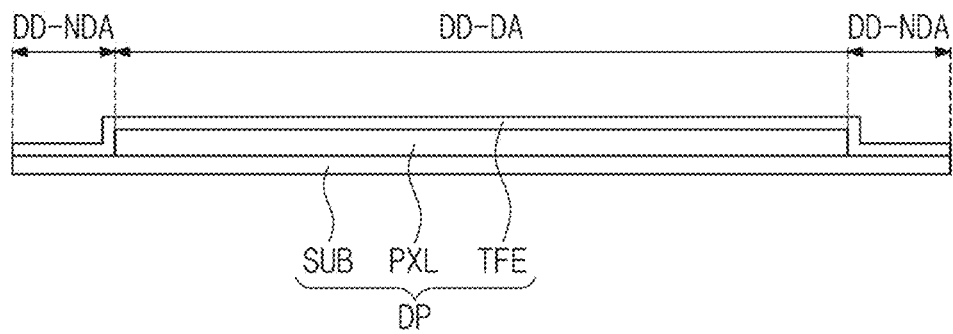
FIG. 4A is a cross-sectional view of an embodiment of a display panel according to the inventive concept.
Figure 4B:
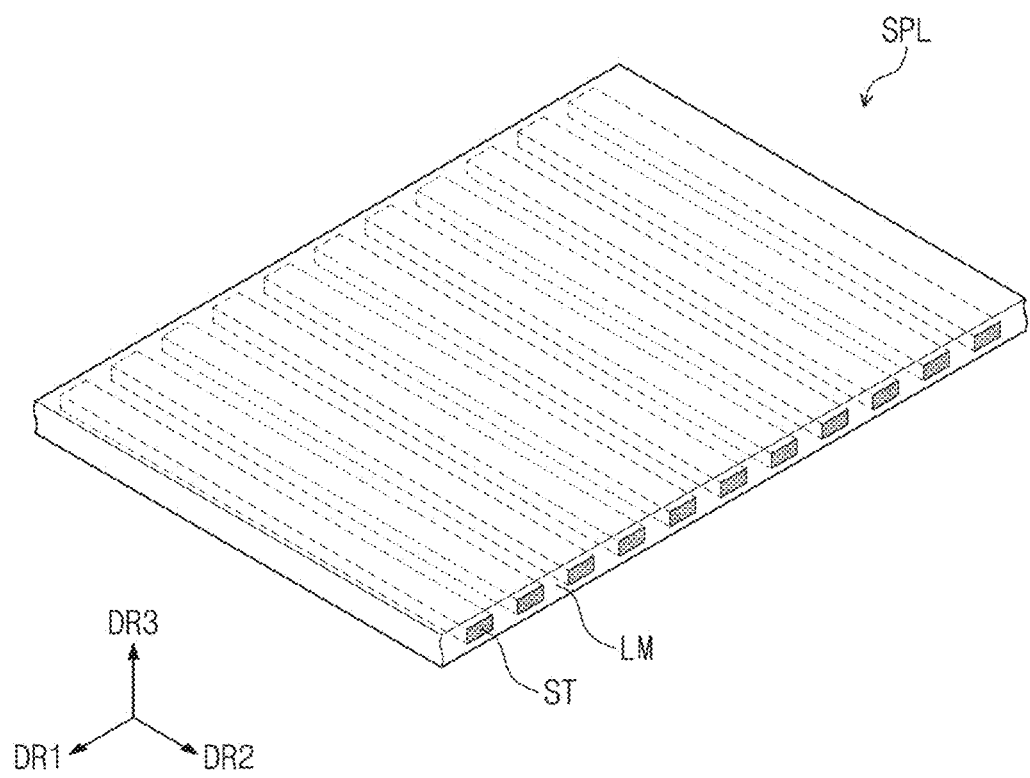
FIG. 4B is a perspective view of an embodiment of a support layer according to the inventive concept.

FIG. 3 is a cross-sectional view of an embodiment of a display device DD according to the inventive concept. FIG. 4A is a cross-sectional view of an embodiment of a display panel DP according to the inventive concept. FIG. 4B is a perspective view of an embodiment of a support layer SPL according to the inventive concept. Hereinafter, the rollable display device DD shown in FIGS. 2A and 2B will be mainly described.

Referring to FIG. 3, the display device DD in an embodiment of the inventive concept may include a support layer SPL, a digitizer DIG, a first elastic layer ESL1, a stress control layer SRL, a display panel protection layer PF, a display module DM, a window WM, and a second elastic layer ESL2. In addition, the display device DD may further include $0^{th}$ to 5th adhesive layers PSA0 to PSA5 disposed between components of the display device DD to bond the components. However, those skilled in the art may understand that the display device DD in an embodiment of the inventive concept may further include other general components in addition to the components shown in FIG. 3.

The support layer SPL may be disposed below the display panel DP to support the display panel DP. The digitizer DIG may be disposed below the display panel DP to convert movement of tools such as pens into digital signals. The digitizer DIG may be a substrate that generates a magnetic field or senses a magnetic field. However, the digitizer DIG may be omitted as desired.

The first elastic layer ESL1 may be disposed on the support layer SPL and may include an elastomer. In an embodiment, the first elastic layer ESL1 may include at least one of thermoplastic polyurethane, silicone, thermoplastic rubber, elastolefin, thermoplastic olefin, polyamide, polyether block amide, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomer, ethylene-vinyl acetate, or polydimethylsiloxane ("PDMS"), for example. However, materials of the first elastic layer ESL1 are not limited thereto.

When the display device DD is rolled, a neutral plane in which deformation does not take place may be disposed around the display panel DP. The first elastic layer ESL1 is spaced far from the display panel DP, and may thus have greater deformation than that of the components close to the display panel DP, when the display device DD is rolled. Accordingly, when the first elastic layer ESL1 has a relatively large modulus, cracks may be caused. The first elastic layer ESL1 may have a modulus of about 5 megapascals (Mpa) to about 100 Mpa.

The modulus of the first elastic layer ESL1 may be proportional to the stiffness of a material. In the case of the first elastic layer ESL1 having a relatively small modulus, when the same stress is applied, the strain rate may be higher, and an elastic section capable of exhibiting elastic force and restoring force may be larger than those in the case in which the modulus is large. Therefore, introduction of the first elastic layer ESL1 may be beneficial in terms of rolling and restoring the display device DD. However, the first elastic layer ESL1 may be omitted as desired.

The stress control layer SRL may include a first auxetic structure AX1, a second adhesive layer PSA2, and a second auxetic structure AX2. The stress control layer SRL may be disposed between the display panel DP and the support layer SPL to overlap the display panel DP. The stress control layer SRL may adhere onto the first elastic layer ESL1 through a first adhesive layer PSA1.

The stress control layer SRL may be a double auxetic structure including the first auxetic structure AX1 and the second auxetic structure AX2. The stress control layer SRL is a double auxetic structure, and accordingly, a thickness of one individual auxetic structure may be reduced. In the case of using the double auxetic structure, the rollability of the display device DD is greater than in the case of using a single auxetic structure having a thickness corresponding to the sum of the thicknesses of the first auxetic structure AX1 and the second auxetic structure AX2.

In this case, the greater rollability indicates that less force is desired for rolling and unrolling the display device DD and less force is desired to return the rolled display device DD to a flat state.

The first auxetic structure AX1 and the second auxetic structure AX2 may be disposed between the display panel DP and the support layer SPL. The first auxetic structure AX1 and the second auxetic structure AX2 may include a non-magnetic material that is not responsive to a magnetic field. When the first auxetic structure AX1 and the second auxetic structure AX2 include or consist of a non-magnetic material, the operation of the digitizer DIG, which recognizes user inputs using a magnetic field, may not be disturbed.

The first auxetic structure AX1 may have a thickness T1 of about 10 micrometers (μm) to about 500 μm along the third direction DR3. The second auxetic structure AX2 may have a thickness T2 of about 10 μm to about 500 μm along the third direction DR3.

The first auxetic structure AX1 and the second auxetic structure AX2 may have a negative Poisson's ratio, which is stretchable in a biaxial direction. The Poisson's ratio of the first auxetic structure AX1 may be about −0.9 to about −0.1. The Poisson's ratio of the second auxetic structure AX2 may be about −0.9 to about −0.1.

The first auxetic structure AX1 and the second auxetic structure AX2 may be bonded through a second adhesive layer PSA2. A resin, a pressure sensitive adhesive ("PSA"), or the like may be used as the second adhesive layer PSA2. However, the type of the second adhesive layer PSA2 is not limited thereto, and various types of adhesives may be used.

The display module DM may include a display panel DP, an input sensing portion ISP, and an anti-reflection layer RPL. The display module DM may generate images. The display module DM may sense user inputs through the input sensing portion ISP. In this case, the input sensing portion ISP may be omitted as desired.

The display panel DP may be a flexible display panel. The display panel DP in an embodiment of the inventive concept may be a light-emitting display panel, and is not particularly limited. In an embodiment, the display panel DP may be an organic light-emitting display panel or an inorganic light-emitting display panel, for example. An emission layer of the organic light-emitting display panel may include an organic light-emitting material. An emission layer of the inorganic light-emitting display panel may include quantum dots, quantum rods, or the like.

The input sensing portion ISP may be disposed on the display panel DP. The input sensing portion ISP may include a plurality of sensors (not shown) for sensing external inputs in a capacitive mode. The input sensing portion ISP may be directly prepared on the display panel DP. However, the inventive concept is not limited thereto, and the input sensing portion ISP is prepared as a panel separate from the display panel DP, and may be bonded to the display panel DP through an adhesive layer.

The anti-reflection layer RPL may be disposed on the input sensing portion ISP. However, the inventive concept is not limited thereto, and the anti-reflection layer RPL may be bonded to the input sensing portion ISP through an adhesive layer. The anti-reflection layer RPL may be defined as an external light anti-reflection film. The anti-reflection layer RPL may reduce reflectance of external light incident from an upper portion of the display device DD toward the display panel DP.

When the external light incident toward the display panel DP is reflected from the display panel DP and provided back external users, like a mirror, the users may view the external light. In order to prevent the above phenomenon, in an embodiment, the anti-reflection layer RPL may include a plurality of color filters displaying the same color as pixels of the display panel DP. The color filters may filter the external light to the same color as the pixels. In this case, the external light may not be viewed by the users.

In another embodiment, the anti-reflection layer RPL may include a polarizing film for reducing the reflectance of external light. The polarizing film may include a retarder and/or a polarizer. The color filters may be formed directly on the input sensing portion ISP. The polarizing film may be bonded to the input sensing portion ISP through an adhesive layer.

The display panel protection layer PF may be disposed on a lower surface of the display panel DP to protect the display panel DP from impact resistance. The display panel protection layer PF may be bonded to the stress control layer SRL through a third adhesive layer PSA3. The display panel protection layer PF is disposed close to the display panel DP adjacent to the neutral plane, deformation may not be significant when the display device DD is rolled. Accordingly, even when the display panel protection layer PF is thick or has a relatively large modulus, cracks are less likely caused.

The display panel protection layer PF may have a modulus of about 1 gigapascal (GPa) to about 10 Gpa. When the modulus of the display panel protection layer PF is less than about 1 Gpa, the display panel DP may not be protected. When the modulus of the display panel protection layer PF is greater than about 10 Gpa, cracks may take place due to deformation caused by rolling of the display device DD.

The display panel protection layer PF may have a thickness of about 10 μm to about 100 μm. When the thickness of the display panel protection layer PF is less than about 10 μm, the display panel DP may not be protected. When the thickness of the display panel protection layer PF is greater than about 100 μm, cracks may take place due to deformation caused by rolling of the display device DD.

The window WM may be disposed on the anti-reflection layer RPL. The window WM may be bonded on the anti-reflection layer RPL through a fourth adhesive layer PSA4. The window WM may protect the display panel DP, the input sensing portion ISP, and the anti-reflection layer RPL from external scratches and shocks.

The second elastic layer ESL2 may be bonded onto the window WM through a fifth adhesive layer PSA5. The second elastic layer ESL2 may be disposed on the window WM and may include an elastomer. In an embodiment, the second elastic layer ESL2 may include at least one of thermoplastic polyurethane, silicone, thermoplastic rubber, elastolefin, thermoplastic olefin, polyamide, polyether block amide, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomer, ethylene-vinyl acetate, or PDMS, for example. However, materials of the second elastic layer ESL2 are not limited thereto.

When the display device DD is rolled, a neutral plane in which deformation does not take place may be disposed around the display panel DP. The second elastic layer ESL2 is spaced far from the display panel DP, and may thus have greater deformation than that of the components close to the display panel DP, when the display device DD is rolled. Accordingly, when the second elastic layer ESL2 has a relatively large modulus, cracks may be caused. The second elastic layer ESL2 may have a modulus of about 5 Mpa to about 100 Mpa.

The modulus of the second elastic layer ESL2 may be proportional to the stiffness of a material. In the case of the second elastic layer ESL2 having a relatively small modulus, when the same stress is applied, the strain rate may be higher, and an elastic section capable of exhibiting elastic force and restoring force may be larger than those in the case in which the modulus is large. Therefore, introduction of the second elastic layer ESL2 may be beneficial in terms of rolling and restoring the display device DD. The second elastic layer ESL2 may protect the window WM from external shocks and contamination.

Referring to FIG. 4A, the display panel DP may include a base layer SUB, a pixel layer PXL, and a thin film encapsulation layer TFE. The display panel DP may generate images. However, the display panel DP may further include other general components in addition to the components shown in FIG. 4A.

The base layer SUB may include a display region DD-DA and a non-display region DD-NDA around the display region DD-DA. The base layer SUB may include a flexible plastic substrate. In an embodiment, the base layer SUB may include a flexible plastic material such as polyimide ("PI"), for example.

The pixel layer PXL may overlap the display region DD-DA. The pixel layer PXL may include a plurality of pixels, and each of the pixels may include a pixel driving circuit and a light-emitting element. The thin film encapsulation layer TFE may include at least two inorganic layers and an organic layer disposed between the inorganic layers. The inorganic layers may include an inorganic material and may protect the pixel layer PXL from moisture/oxygen. The organic layer may include an organic material, and may protect the pixels PXL from foreign materials such as dust particles.

Referring to FIG. 4B, the support layer SPL may include support sticks ST and an outer layer LM. The support sticks ST may extend in the same direction as the direction in which the roller ROL (refer to FIG. 2A) extends. A plurality of support sticks ST may be parallel. The plurality of support sticks ST may be arranged along the first direction DR1 crossing the roller ROL. The plurality of support sticks ST may be spaced apart at equal intervals, but the intervals of the support sticks ST are not limited thereto.

The plurality of support sticks ST may have a rigid property. In an embodiment, the plurality of support sticks ST may include metal. The support sticks ST may include aluminum, stainless, or invar, for example. In addition, the support sticks ST may include metal bonded to magnets.

The plurality of support sticks ST may support the display module DM shown in FIG. 3, so that the display device DD of the first mode described with reference to FIG. 2A may provide a flat display surface DD-IS.

In FIG. 4B, a plurality of support sticks ST having a quadrangular cross section, e.g., rectangular cross section, are shown in an embodiment, but are not limited thereto. The plurality of support sticks ST may be stacked in two layers along the third direction DR3.

The outer layer LM may fix the plurality of support sticks ST spaced apart from each other. The outer layer LM may absorb stress generated by the plurality of support sticks ST upon repetitive rolling.

The outer layer LM may include an elastic polymer having elasticity. In an embodiment, the outer layer LM may include at least one of thermoplastic polyurethane, silicone, thermoplastic rubber, elastolefin, thermoplastic olefin, polyamide, polyether block amide, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomer, ethylene-vinyl acetate, or PDMS, for example. However, materials of the outer layer LM are not limited thereto.

When the outer layer LM is not used and the support sticks ST are bonded to a lower surface of the display module DM to support the display module DM, the display module DM may be deformed. In an embodiment, when the display module DM is repeatedly rolled and unrolled, a portion of the display module DM overlapping a space between the plurality of support sticks ST may be stretched to sag downward, for example. Such deformation may be externally viewed as a wrinkle shape. That is, the display module DM may have degradation in surface quality.

The support sticks ST may have a larger modulus than that of the outer layer LM. The outer layer LM may have a modulus of about 20 kilopascals (Kpa) to about 20 Mpa. The support sticks ST may have a modulus of about 1 Gpa to about 200 Gpa.

The support sticks ST having greater rigidity may support the display module DM, and the outer layer LM having a predetermined elasticity may provide a flat surface to the display module DM. The display module DM is bonded to the outer layer LM having a flat surface, and accordingly, the portion of the display module DM overlapping the space between the support sticks ST is not deformed and may remain flat. That is, the display module DM may have an improvement in surface quality.

Figure 5A:
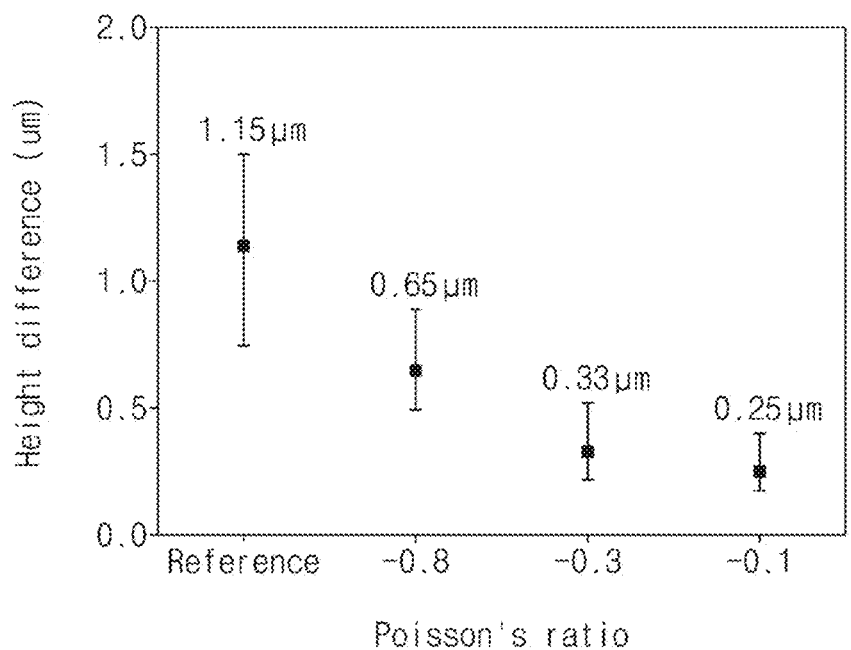
FIGS. 5A and 5B are graphs showing step characteristics and surface roughness according to the Poisson's ratio.
Figure 5B:
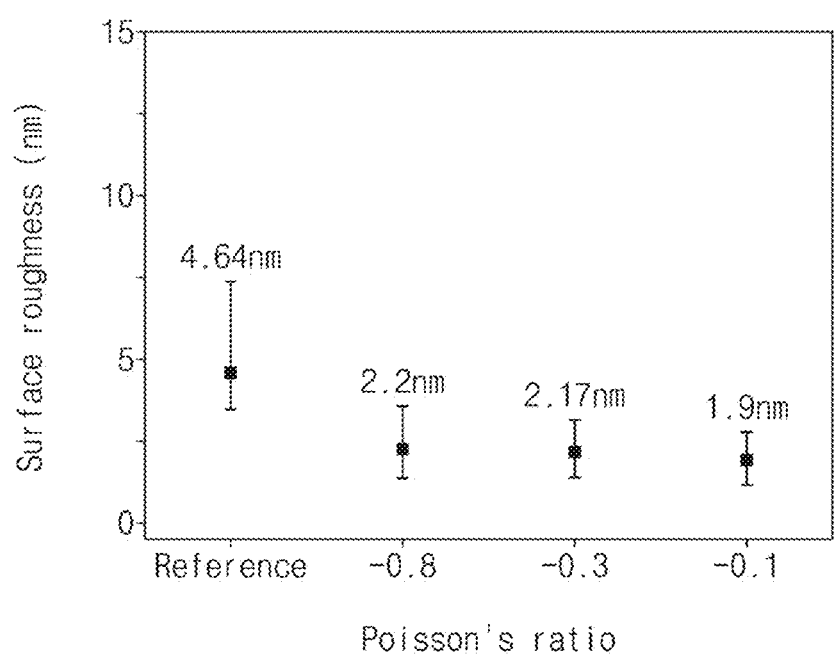

FIGS. 5A and 5B are graphs showing step characteristics and surface roughness according to the Poisson's ratio.

In FIGS. 5A and 5B, the results of rolling tests using display devices for testing are shown as graphs. The display devices for testing may include two PDMS layers formed on the plurality of support sticks ST (refer to FIG. 4B) through spin coating, an auxetic structure disposed between the two PDMS layers, and a polyimide layer disposed on an upper portion of the PDMS layer.

The display devices for testing in Comparative Examples (reference) of FIGS. 5A and 5B are cases in which an auxetic structure is not disposed, and the display devices for testing of −0.1, −0.3, and −0.8 of FIGS. 5A and 5B are cases in which the Poisson's ratio of the organic structure is −0.1, −0.3, and −0.8, individually. The rolling test shows the result of 20,000 rolling operations. One rolling operation indicates starting in the first mode of FIG. 2A, going through the second mode of FIG. 2B, and returning to the state of the first mode.

A vertical axis of the graph of FIG. 5A indicates a height difference caused by deformation of the polyimide layer before and after the rolling test.

Referring to FIG. 5A, a height difference of the polyimide layer in the case where the auxetic structure is not disposed (reference) is about 1.15 µm, indicating greater deformation of the polyimide layer than that of the other cases (0.65 µm, 0.33 µm, and 0.25 µm) in which the auxetic structure is disposed. In addition, when the Poisson's ratio of the auxetic structure is about −0.1, it is seen that a height difference of the polyimide layer is 0.25 µm, which is the smallest. It is seen that the deformation of the polyimide layer is less as the Poisson's ratio of the auxetic structure is closer to 0.

A vertical axis of the graph in FIG. 5B indicates surface roughness (arithmetic average roughness, Ra) of the polyimide layer before and after rolling. Referring to FIG. 5B, it is seen that the surface roughness (2.2 nm, 2.17 nm, 1.9 nm) in the case where the auxetic structure is disposed is smaller than the surface roughness (4.64 nm) in the case where the auxetic structure is not disposed (reference). In addition, it is seen that the surface roughness of the polyimide layer is less as the Poisson's ratio of the auxetic structure is closer to 0. Referring to FIGS. 5A and 5B, as the Poisson's ratio of the auxetic structure is closer to 0, stress generated upon rolling is reduced to cause less deformation of the polyimide layer and t to reduce the surface roughness, resulting in improved surface quality.

Figure 6:
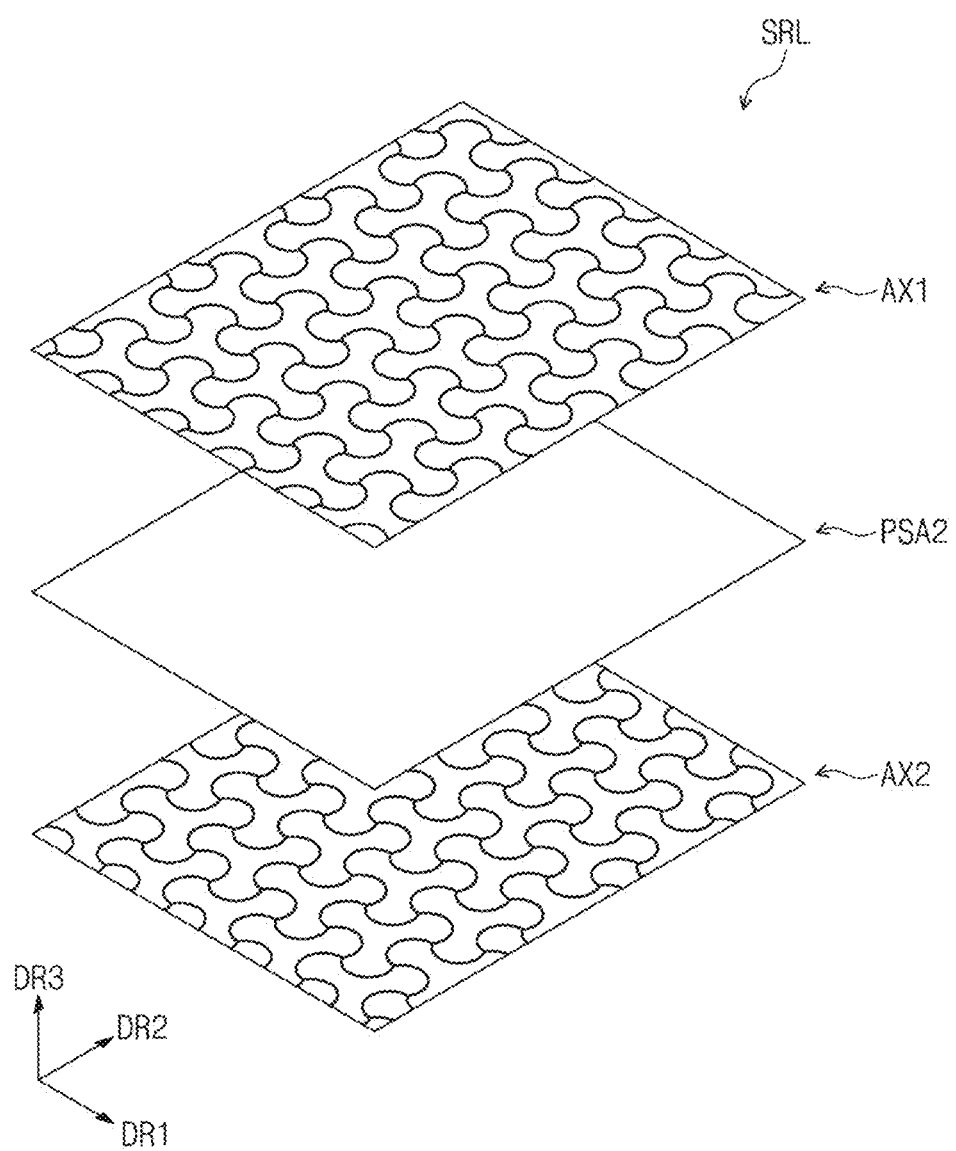
FIG. 6 is a perspective view of an embodiment of a stress control layer according to the inventive concept.
Figure 7A:
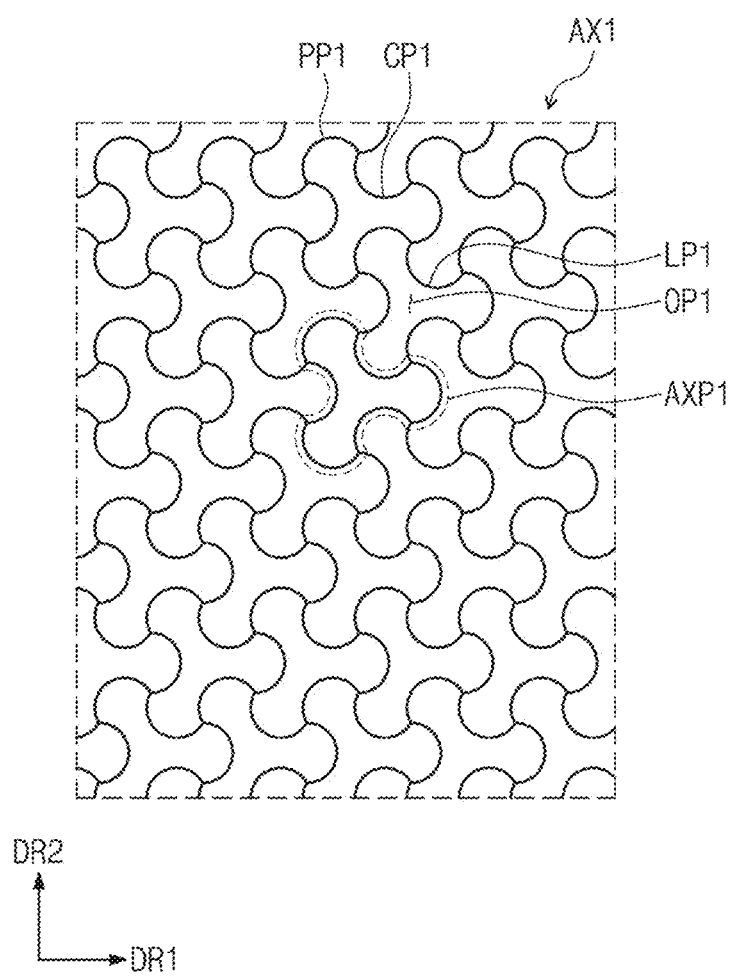
FIG. 7A is a plan view showing an embodiment of a first auxetic structure according to the inventive concept.
Figure 7B:
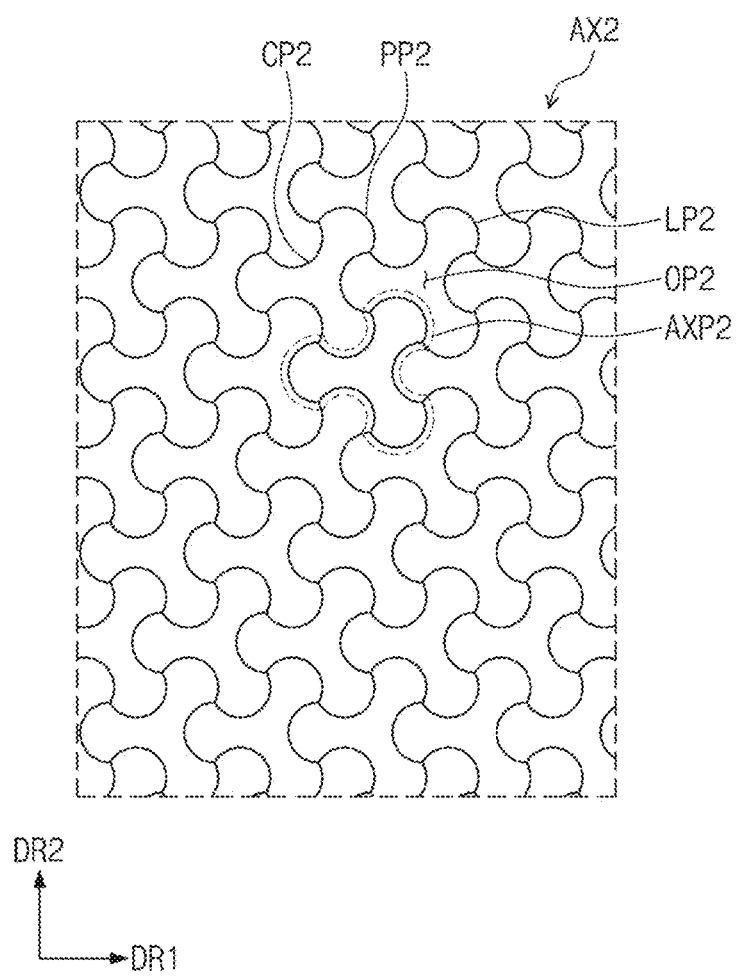
FIG. 7B is a plan view showing an embodiment of a second auxetic structure according to the inventive concept.

FIG. 6 is a perspective view of an embodiment of a stress control layer SRL according to the inventive concept. FIG. 7A is a plan view showing an embodiment of a first auxetic structure AX1 according to the inventive concept. FIG. 7B is a plan view showing an embodiment of a second auxetic structure AX2 according to the inventive concept.

Referring to FIG. 6, the stress control layer SRL may include the first auxetic structure AX1, the second adhesive layer PSA2, and the second auxetic structure AX2. The first auxetic structure AX1, the second adhesive layer PSA2, and the second auxetic structure AX2 may be sequentially stacked.

Referring to FIG. 7A, the first auxetic structure AX1 may include a first pattern LP1 defining first openings OP1. The first pattern LP1 may form a plurality of closed curves. The first pattern LP1 may have a shape in which closed curves having the same shape are repeated. The repeated unit closed curves may be a first unit cell AXP1.

The first unit cell AXP1 may include a plurality of first protrusions PP1 and a plurality of first concave portions CP1. The plurality of first protrusions PP1 may be curved portions having a convex shape from the center of the first unit cell AXP1 to the outside of the first unit cell AXP1. The plurality of first concave portions CP1 may be curved portions having a convex shape from the outside of the first unit cell AXP1 toward the center of the first unit cell AXP1.

The plurality of first concave portions CP1 may be disposed between the plurality of first protrusions PP1. The first protrusions PP1 and the first concave portions CP1 may have the same radius of curvature as each other.

The plurality of first protrusions PP1 of the first unit cell AXP1 may have the same maximum distance away from the center of the first unit cell AXP1. The plurality of first concave portions CP1 of the first unit cell AXP1 may have the same minimum distance away from the center of the first unit cell AXP1. The first concave portions CP1 of the first unit cell AXP1 may overlap the first protrusions PP1 of other adjacent unit cells.

The plurality of first protrusions PP1 may keep a constant angle with respect to the center of the first unit cell AXP1 as a rotation axis. That is, one protrusion of the first protrusions PP1 may overlap another protrusion of the first protrusions PP1 when rotated at a predetermined angle with respect to the first unit cell AXP1. In an embodiment, when one of the plurality of first protrusions PP1 shown in FIG. 7A may overlap another protrusion of the plurality of first protrusions PP1 when rotated 120° with respect to the center of the first unit cell AXP1 as a rotation axis, for example.

The plurality of first concave portions CP1 may keep a constant angle with respect to the center of the first unit cell AXP1 as a rotation axis. That is, one concave portion of the first concave portions CP1 may overlap another concave portion of the first concave portions CP1 when rotated at a predetermined angle with respect to the first unit cell AXP1. In an embodiment, when one concave portion of the plurality of first concave portions CP1 shown in FIG. 7A may overlap another concave portion of the plurality of first concave portions CP1 when rotated 120° with respect to the center of the first unit cell AXP1 as a rotation axis, for example.

FIG. 7A shows that the number of the first protrusions PP1 and the first concave portions CP1 is three, but is not limited thereto, and the number of first protrusions PP1 and first concave portions CP1 may increase or decrease.

First openings OP1 may be defined inside the first unit cell AXP1. The first auxetic structure AX1 shown in FIG. 7A may be an auxetic structure having a Poisson's ratio of about −0.1. However, the shape of the first auxetic structure AX1 is not limited thereto and may vary.

Referring to FIG. 7B, the second auxetic structure AX2 may include a second pattern LP2 defining second openings OP2. The second pattern LP2 may form a plurality of closed curves. The second pattern LP2 may have a shape in which closed curves having the same shape are repeated. The repeated unit closed curves may be a second unit cell AXP2. Second openings OP2 may be defined inside the second unit cell AXP2.

The second unit cell AXP2 may include a plurality of second protrusions PP2 and a plurality of second concave portions CP2. The plurality of second protrusions PP2 may be curved portions having a convex shape from the center of the second unit cell AXP2 to the outside of the second unit cell AXP2. The plurality of second concave portions CP2 may be curved portions having a convex shape from the outside of the second unit cell AXP2 toward the center of the second unit cell AXP2.

The plurality of second concave portions CP2 may be disposed between the plurality of second protrusions PP2. The second protrusions PP2 and the second concave portions CP2 may have the same radius of curvature as each other.

The plurality of second protrusions PP2 of the second unit cell AXP2 may have the same maximum distance away from the center of the second unit cell AXP2. The plurality of second concave portions CP2 of the second unit cell AXP2 may have the same minimum distance away from the center of the second unit cell AXP2. The second concave portions CP2 of the second unit cell AXP2 may overlap the second protrusions PP2 of other adjacent unit cells.

The plurality of second protrusions PP2 may keep a constant angle with respect to the center of the second unit cell AXP2 as a rotation axis. That is, one protrusion of the second protrusions PP2 may overlap another protrusion of the second protrusions PP2 when rotated at a predetermined angle with respect to the second unit cell AXP2. In an embodiment, when one of the plurality of second protrusions PP2 shown in FIG. 7B may overlap another protrusion of the plurality of second protrusions PP2 when rotated 120° with respect to the center of the second unit cell AXP2 as a rotation axis, for example.

The plurality of second concave portions CP2 may keep a constant angle with respect to the center of the second unit cell AXP2 as a rotation axis. That is, one concave portion of the second concave portions CP2 may overlap another concave portion of the second concave portions CP2 when rotated at a predetermined angle with respect to the center of the second unit cell AXP2 as a rotation axis. In an embodiment, when one concave portion of the plurality of second concave portions CP2 shown in FIG. 7B may overlap another concave portion of the plurality of second concave portions CP2 when rotated 120° with respect to the center of the second unit cell AXP2 as a rotation axis, for example.

FIG. 7B shows that the number of the second protrusions PP2 and the second concave portions CP2 is three, but is not limited thereto, and the number of second protrusions PP2 and second concave portions CP2 may increase or decrease.

Referring to FIGS. 7A and 7B, the second pattern LP2 may be a pattern in which the first pattern LP1 is rotated 180 degrees in a plan view. However, herein the rotation angle in the plan view is not limited to 180 degrees and may be changed as desired.

The first protrusion PP1 disposed on an upper portion of the first unit cell AXP1 may face left with reference to a reference line passing through the center of the first unit cell AXP1 and parallel to the second direction DR2. The second protrusion PP2 disposed on an upper portion of the second unit cell AXP2 may face right with reference to a reference line passing through the center of the second unit cell AXP2 and parallel to the second direction DR2. Accordingly, the first protrusions PP1 of the first unit cell AXP1 and the second protrusions PP2 of the second unit cell AXP2 may not overlap in a plan view.

Figure 8:
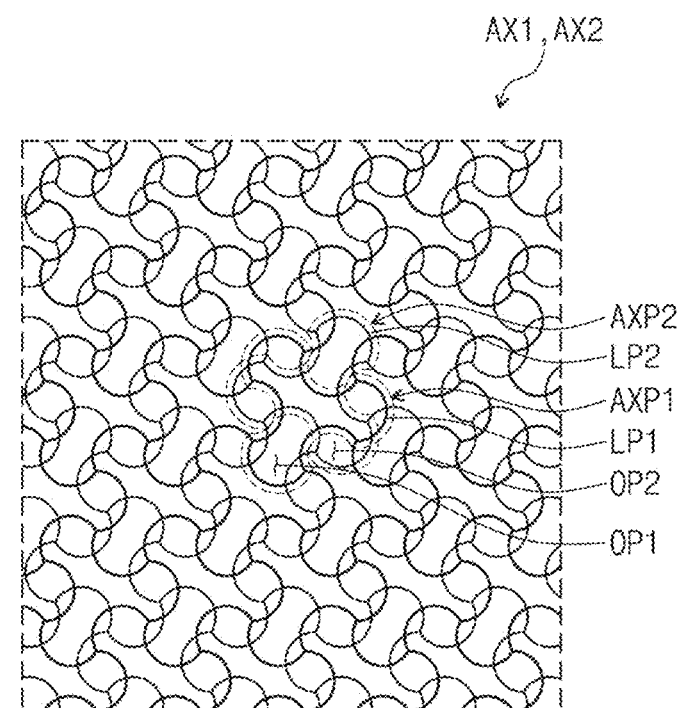
FIG. 8 is a plan view showing an embodiment of a first auxetic structure and a second auxetic structure which overlap according to the inventive concept.
Figure 8:
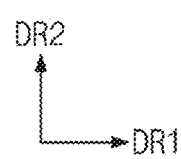
Figure 9:
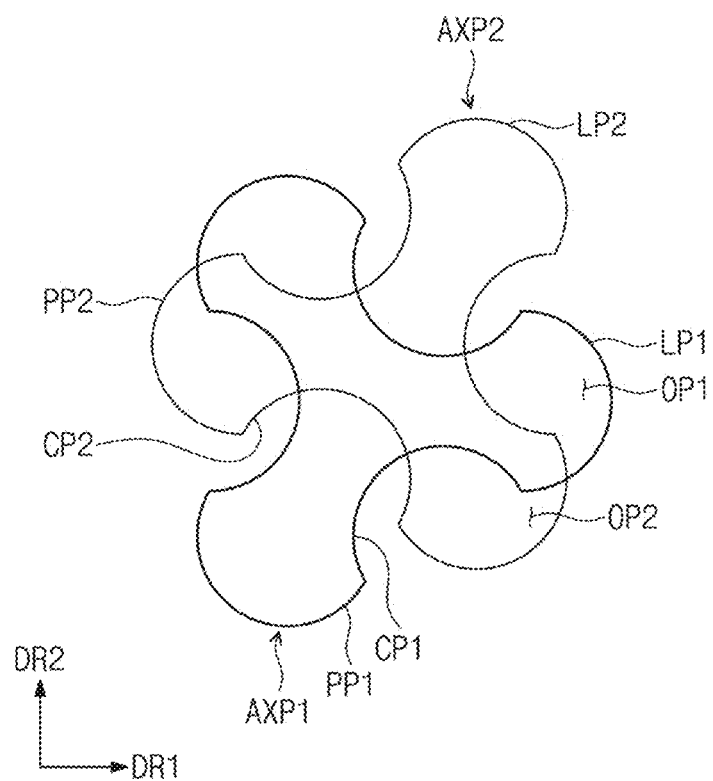
FIG. 9 is a plan view showing an embodiment of a first unit cell and a second unit cell according to the inventive concept.

FIG. 8 is a plan view showing an embodiment of a first auxetic structure AX1 and a second auxetic structure AX2 which overlap according to the inventive concept. FIG. 9 is a plan view showing an embodiment of a first unit cell AXP1 and a second unit cell AXP2 according to the inventive concept.

Referring to FIG. 8, the first pattern LP1 of the first auxetic structure AX1 may overlap the second openings OP2 of the second auxetic structure AX2 in a plan view. The second pattern LP2 of the second auxetic structure AX2 may overlap the first openings OP1 of the first auxetic structure AX1 in a plan view. That is, in a plan view, the first pattern LP1 may cover the second openings OP2 and the second pattern LP2 may cover the first openings OP1. Accordingly, when the first auxetic structure AX1 and the second auxetic structure AX2 overlap, the entirety of the first and second auxetic structures AX1 and AX2 may have a planar opening ratio of about 10% to about 60%.

When the opening ratio of the entirety of the first and second auxetic structures AX1 and AX2 is less than about 10%, impact resistance may be improved, but rollability may be reduced. When the opening ratio of the entirety of the first and second auxetic structures AX1 and AX2 is greater than 60%, rollability may be improved, but impact resistance may be reduced. Therefore, when both impact resistance and rollability are considered, the opening ratio of the entirety of the first and second auxetic structures AX1 and AX2 may preferably be about 10% to about 60%.

Referring to FIG. 9, when the first unit cell AXP1 and the second unit cell AXP2 overlap in a plan view, the first pattern LP1 and the second pattern LP2 may cross each other. On a plane, the first pattern LP1 may cross a region occupied by the second opening OP2. On a plane, the second pattern LP2 may cross a region occupied by the first opening OP1. The plurality of first protrusions PP1 of the first unit cell AXP1 may protrude in a different direction from the plurality of second protrusions PP2 of the second unit cell AXP2.

Figure 10A:
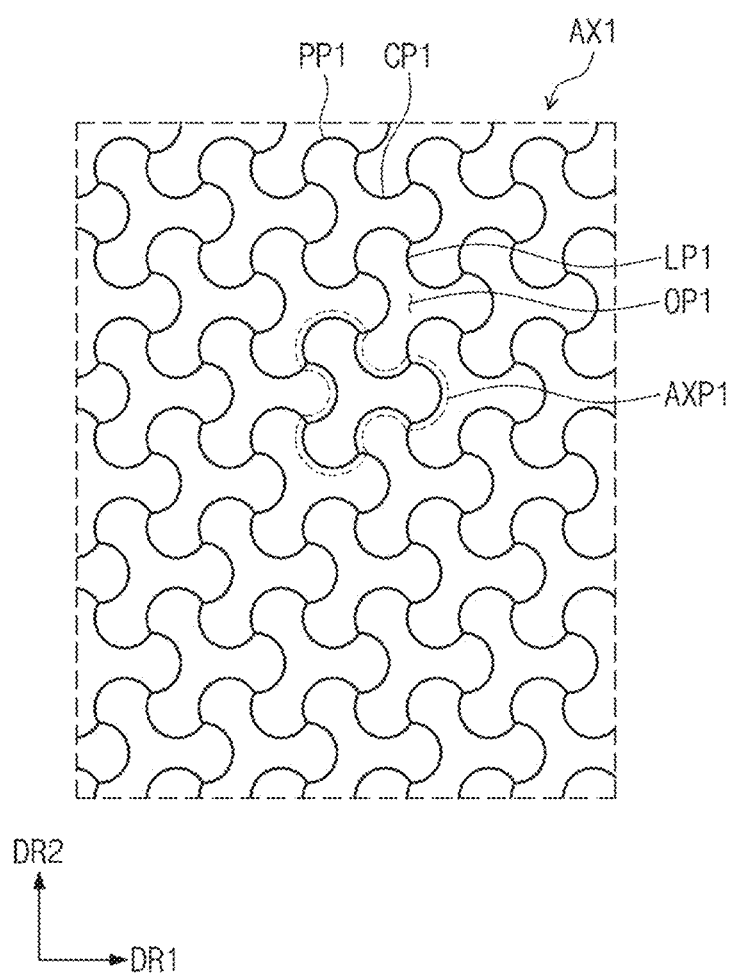
FIG. 10A is a plan view showing an embodiment of a first auxetic structure according to the inventive concept.
Figure 10B:
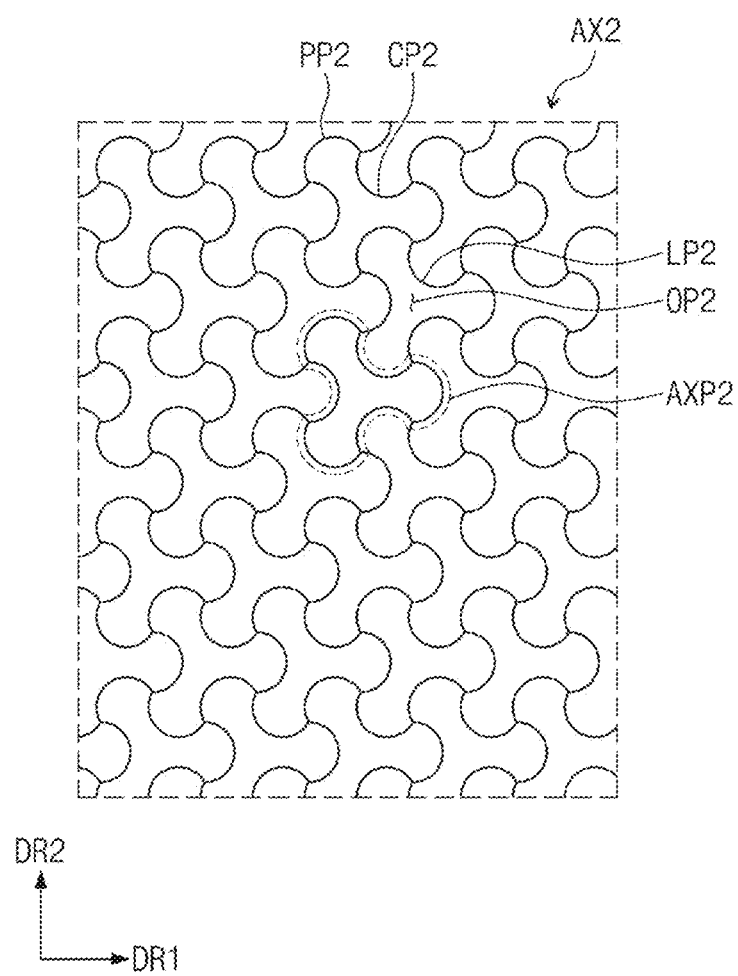
FIG. 10B is a plan view showing an embodiment of a second auxetic structure according to the inventive concept.

FIG. 10A is a plan view showing an embodiment of a first auxetic structure AX1 according to the inventive concept. FIG. 10B is a plan view showing an embodiment of a second auxetic structure AX2 according to the inventive concept.

Referring to FIG. 10A, the first auxetic structure AX1 may include a first pattern LP1 defining first openings OP1. The first pattern LP1 may define a first unit cell AXP1 including a plurality of first protrusions PP1 and a plurality of first concave portions CP1 disposed between the plurality of first protrusions PP1. The first auxetic structure AX1 shown in FIG. 10A may be the same as the first auxetic structure AX1 shown in FIG. 7A.

Referring to FIG. 10B, the second auxetic structure AX2 may include a second pattern LP2 defining second openings OP2. The second pattern LP2 may define a second unit cell AXP2 including a plurality of second protrusions PP2 and a plurality of second concave portions CP2 disposed between the plurality of second protrusions PP2. Second openings OP2 may be defined inside the second unit cell AXP2. The second auxetic structure AX2 shown in FIG. 10B may be the same as the first auxetic structure AX1 shown in FIG. 10A. That is, when the first pattern LP1 and the second pattern LP2 overlap, the first pattern LP1 and the second pattern LP2 may be the same pattern.

Figure 11:
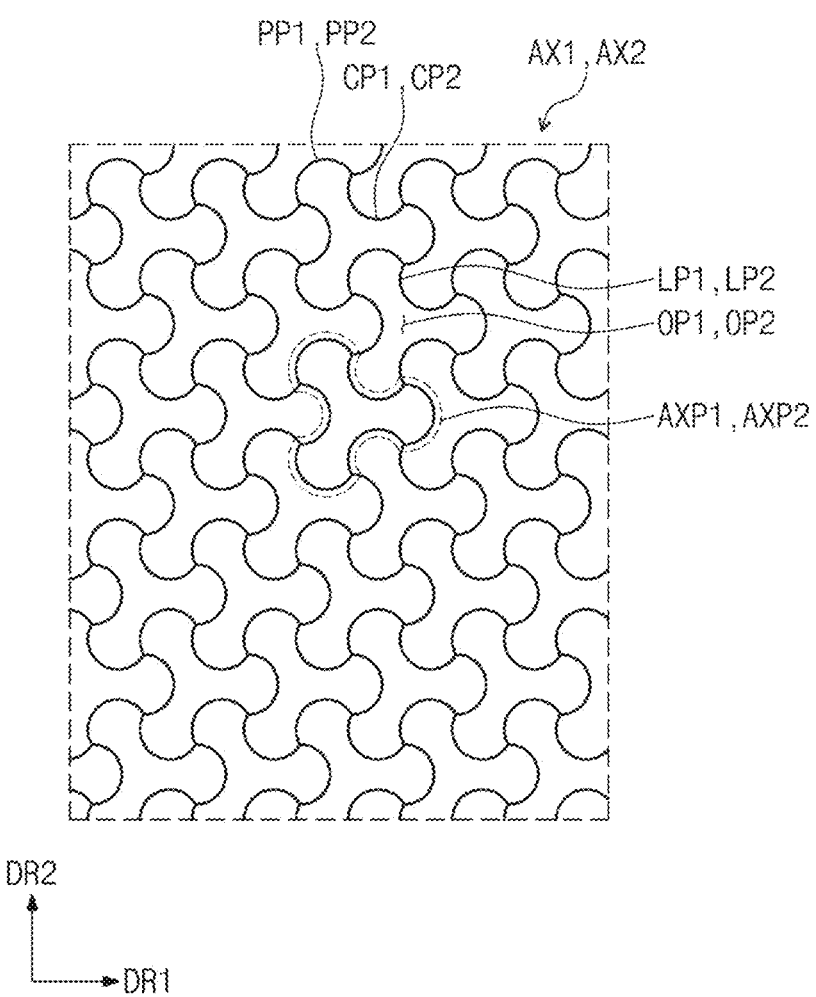
FIG. 11 is a plan view showing an embodiment of a first auxetic structure and a second auxetic structure which overlap according to the inventive concept.

FIG. 11 is a plan view showing an embodiment of a first auxetic structure AX1 and a second auxetic structure AX2 which overlap according to the inventive concept.

Referring to FIG. 11, the first pattern LP1 of the first auxetic structure AX1 may overlap the second pattern LP2 of the second auxetic structure AX2 in a plan view. As described above, the first pattern LP1 and the second pattern LP2 are the same pattern, and accordingly, when the first pattern LP1 and the second pattern LP2 overlap at corresponding positions, the first pattern LP1 may not overlap the second openings OP2 in a plan view, and the second pattern LP2 may not overlap the first openings OP1 in a plan view.

However, when line widths of the first pattern LP1 and the second pattern LP2 are different or the first pattern LP1 and the second pattern LP2 do not exactly overlap at corresponding positions, a portion of the first pattern LP1 may overlap the second openings OP2 in a plan view, and a portion of the second pattern LP2 may overlap the first openings OP1 in a plan view.

As such, when the first pattern LP1 and the second pattern LP2 are the same pattern, in a plan view, the first pattern LP1 and the second pattern LP2 may not cover the first openings OP1 and the second openings OP2. Accordingly, when the first auxetic structure AX1 and the second auxetic structure AX2 overlap, the entirety of the first and second auxetic structures AX1 and AX2 may have a planar opening ratio of about 70% or greater. This is in contrast to the case where the planar opening ratio of the entirety of the first and second auxetic structures AX1 and AX2 of FIG. 8 is about 10% to about 60%.

When the planar opening ratio of the entirety of the first and second auxetic structures AX1 and AX2 is greater than about 70%, impact resistance may be reduced, but rollability may be improved. Therefore, when the display panel DP is less desired to be protected or relatively high rollability is desired in the display device DD, the first auxetic structure AX1 and the second auxetic structure AX2 as shown in FIG. 11 may be used.

Figure 12:
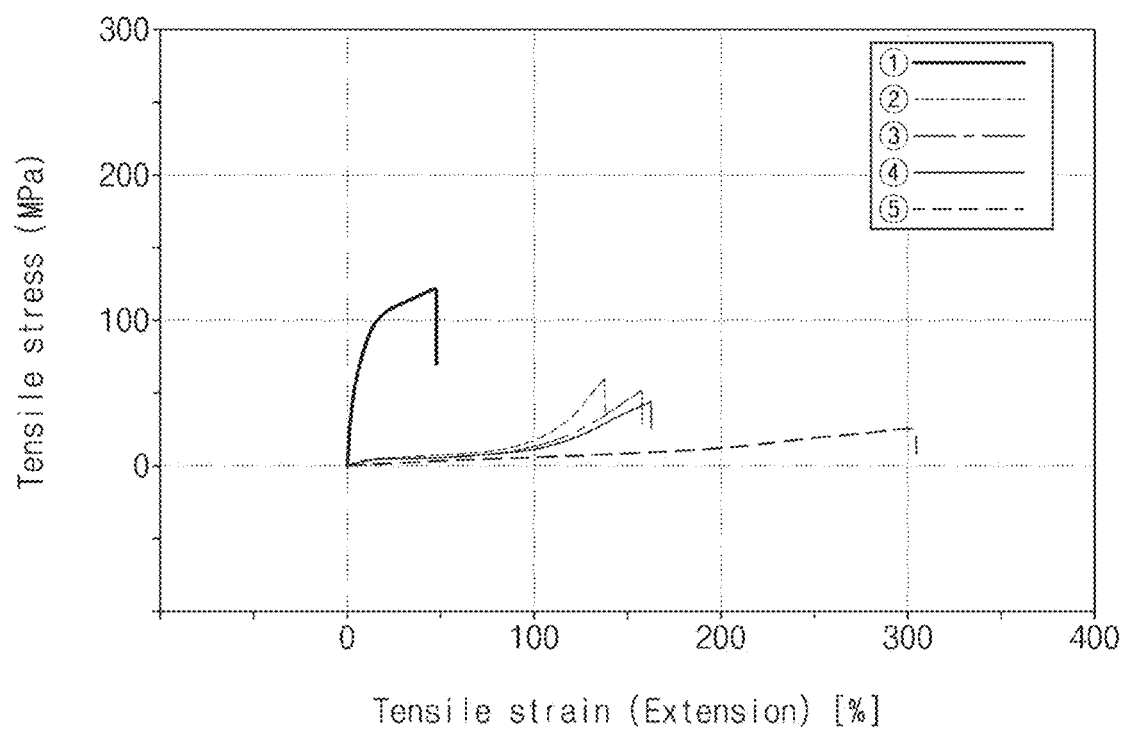
FIG. 12 is a graph showing stress strain curves of stress control layers according to Comparative Examples and Embodiments of the inventive concept.

FIG. 12 is a graph showing stress strain curves of a stress control layer SRL according to Comparative Examples and an embodiment of the inventive concept.

Referring to FIG. 12, tensile tests were performed on the stress control layer SRL of Comparative Examples 1 to 3 and Embodiments 1 and 2 of the inventive concept. Comparative Example 1 used black polyimide ("BPI") having a thickness of 50 μm as the stress control layer SRL. Comparative Example 2 used a single auxetic structure having a thickness of 50 μm as the stress control layer SRL. Comparative Example 3 used thermoplastic polyurethane ("TPU") having a thickness of 100 μm as the stress control layer SRL. Embodiment 1 used, as the stress control layer SRL, two auxetic structures having a thickness of 50 μm and a pressure sensitive adhesive ("PSA") having a thickness of 16 μm that bonds the two auxetic structures. Embodiment 2 used, as the stress control layer SRL, two auxetic structures having a thickness of 50 μm and a pressure sensitive adhesive having a thickness of 25 μm that bonds the two auxetic structures. In this case, the auxetic structure may include or consist of steel use stainless ("SUS").

The experimental results of Comparative Example 1 are shown in Graph 1, the experimental results of Comparative Example 2 are shown in Graph 2, the experimental results of Embodiment 1 of the inventive concept are shown in Graph 3, the experimental results of Embodiment 2 of the inventive concept are shown in Graph 4, and the experimental results of Comparative Example 3 are shown in Graph 5. The predetermined experimental data are shown in the following table.

TABLE 1

| | Comparative Example 1 | Comparative Example 2 | Embodiment 1 | Embodiment 2 | Comparative Example 3 |
| --- | --- | --- | --- | --- | --- |
| Elongation (%) | 46 | 138 | 157 | 162 | 302 |
| Modulus | 2 Gpa | 161 Mpa | 86 Mpa | 64 Mpa | 14 Mpa |

Referring to Table 1 and FIG. 12, it is seen that the stress control layers SRL of Embodiments 1 and 2 of the inventive concept exhibit similar behavior to that of an elastic body. That is, it is seen that when two auxetic structures and a pressure sensitive adhesive bonding the two auxetic structures are used as the stress control layer SRL, the behavior is similar to that of the thermoplastic polyurethane of Comparative Example 3, which is an elastic body. Based on this elastic force, the stress control layers SRL of Embodiments 1 and 2 may reduce deformation of the display device DD even when the display device DD (refer to FIG. 2A) is repeatedly folded or rolled, thereby improving surface quality.

The stress control layer SRL of Embodiment 1 has a modulus of about 86 Mpa, which is lower than Comparative Example 1 having a modulus of about 2 Gpa and Comparative Example 2 having a modulus of about 161 Mpa. This is because the modulus of the pressure sensitive adhesive disposed between the two auxetic structures in Embodiment 1 was as relatively low as about 1 Mpa or less. The stress control layer SRL of Embodiment 2 has a modulus of about 64 Mpa, which is lower than those of Comparative Examples 1 and 2. In addition, Embodiment 2 has a lower modulus value of about 64 Mpa than Embodiment 1 having a modulus value of about 86 Mpa. This is because the pressure sensitive adhesive of Embodiment 2 having a relatively low modulus value has a greater thickness of about 25 μm than the pressure sensitive adhesive of Embodiment 1 having a thickness of about 16 μm.

When the modulus is low, when the strain rate is the same, generated stress is small, and thus the external force desired for deformation may be reduced. In addition, the elastic range of Embodiments 1 and 2 is increased compared to Comparative Examples 1 and 2, and restoring force may thus be maintained even when a relatively high strain is applied. Therefore, the display device DD (refer to FIG. 2A) to which the stress control layer SRL in embodiments of the inventive concept is applied desires less force for rolling and has excellent restoring properties to return to an original state after rolling, resulting in improved rollability. However, the thermoplastic polyurethane of Comparative Example 3 is hardly seen as a robust structure against deformation, and impact resistance may thus be reduced. Therefore, considering both impact resistance and rollability, the stress control layers SRL of Embodiments 1 and 2 of the inventive concept may be most suitable.

Figure 13A:
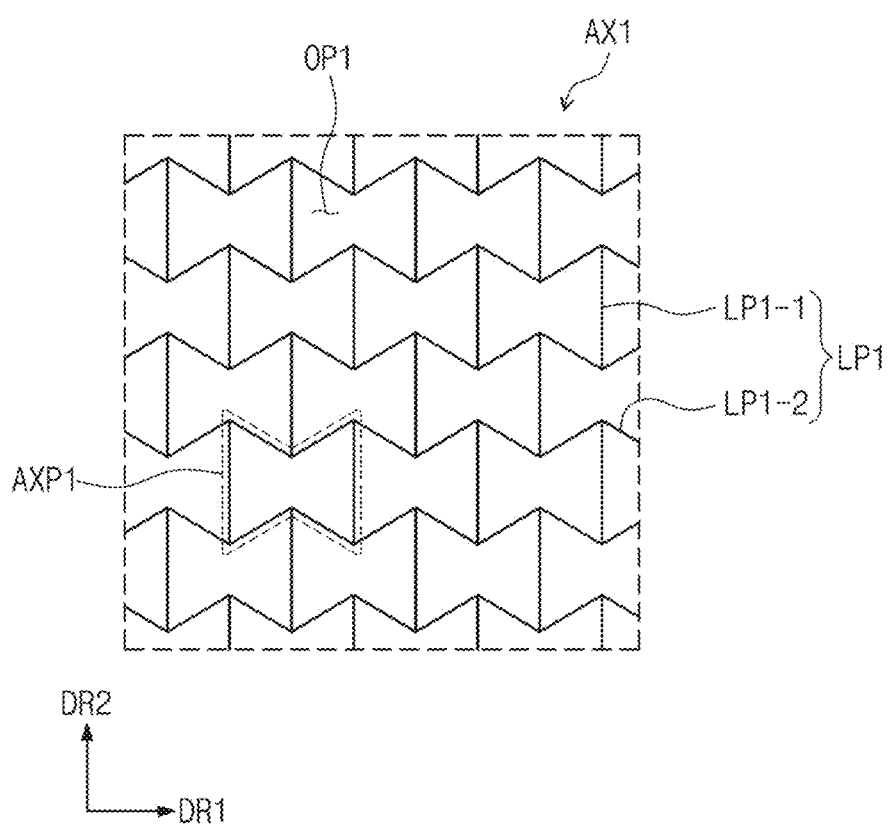
FIGS. 13A and 13B are plan views showing an embodiment of a first auxetic structure and a second auxetic structure according to the inventive concept.
Figure 13B:
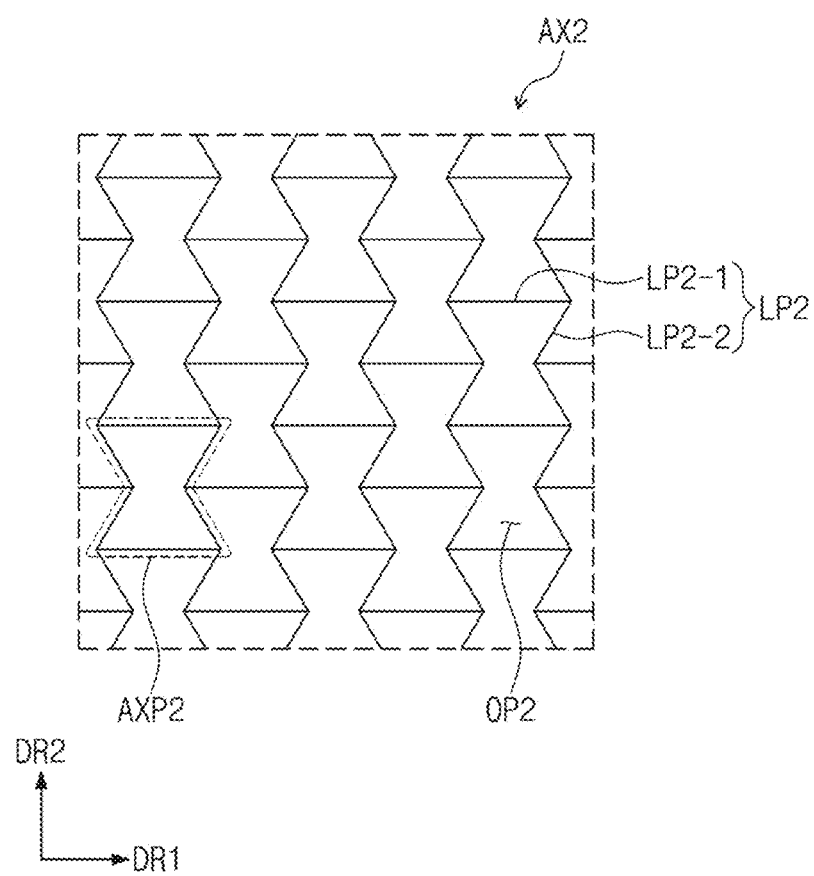
Figure 13C:
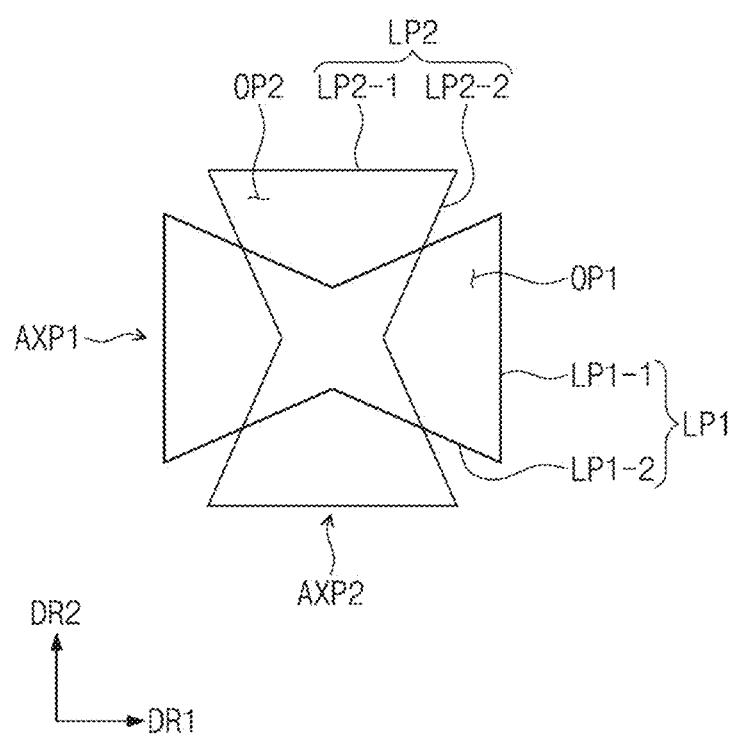
FIG. 13C is a plan view enlarging an embodiment of a first unit cell and a second unit cell which overlap according to the inventive concept.

FIGS. 13A and 13B are plan views showing an embodiment of a first auxetic structure AX1 and a second auxetic structure AX2 according to the inventive concept. FIG. 13C is a plan view enlarging an embodiment of a first unit cell AXP1 and a second unit cell AXP2 which overlap according to the inventive concept.

Referring to FIG. 13A, the first auxetic structure AX1 may include a first pattern LP1 having a negative Poisson's ratio and defining first openings OP1. The first auxetic structure AX1 of FIG. 13A may have a Poisson's ratio of about −0.8. The first pattern LP1 may include (1-1)-th components LP1-1 and (1-2)-th components LP1-2 extending in a different direction from the (1-1)-th components LP1-1.

The (1-1)-th components LP1-1 may extend in the second direction DR2. The (1-2)-th components LP1-2 may extend in the first direction DR1. Each of the (1-1)-th components LP1-1 may be disposed between two adjacent (1-2)-th components LP1-2 in the second direction DR2. Each of the (1-2)-th components LP1-2 may be bent concavely and may extend in the first direction DR1.

Two adjacent (1-1)-th components LP1-1 in the first direction DR1 and two adjacent (1-2)-th components LP1-2 in the second direction DR2 may form one first unit cell AXP1.

Referring to FIG. 13B, the second auxetic structure AX2 may include a second pattern LP2 having a negative Poisson's ratio and defining second openings OP2. The second pattern LP2 may include (2-1)-th components LP2-1 and (2-2)-th components LP2-2 extending in a different direction from the (2-1)-th components LP2-1.

The second pattern LP2 may be a pattern in which the first pattern LP1 (refer to FIG. 13A) is rotated 90 degrees in a plan view. However, herein the rotation angle in the plan view is not limited to 90 degrees and may be changed as desired.

The (2-1)-th components LP2-1 and (2-2)-th components LP2-2 are the cases in which the (1-1)-th components LP1-1 and the (1-2)-th components LP1-2 of FIG. 13A are rotated 90 degrees in a plan view, and a detailed description thereof will be omitted.

Two adjacent (2-1)-th components LP2-1 in the second direction DR2 and adjacent (2-2)-th components LP2-2 in the first direction DR1 may form one second unit cell AXP2.

Referring to FIG. 13C, shapes of the first unit cell AXP1 and the second unit cell AXP2 in a plan view when the first auxetic structure AX1 of FIG. 13A and the second auxetic structure AX2 of FIG. 13B overlap are shown.

The first pattern LP1 of the first auxetic structure AX1 may overlap the second openings OP2 of the second auxetic structure AX2 in a plan view. The second pattern LP2 of the second auxetic structure AX2 may overlap the first openings OP1 of the first auxetic structure AX1 in a plan view. That is, in a plan view, the first pattern LP1 may cover the second openings OP2 and the second pattern LP2 may cover the first openings OP1. Accordingly, when the first auxetic structure AX1 and the second auxetic structure AX2 overlap, the entirety of the first and second auxetic structures AX1 and AX2 may have a planar opening ratio of about 10% to about 60%.

Figure 14A:
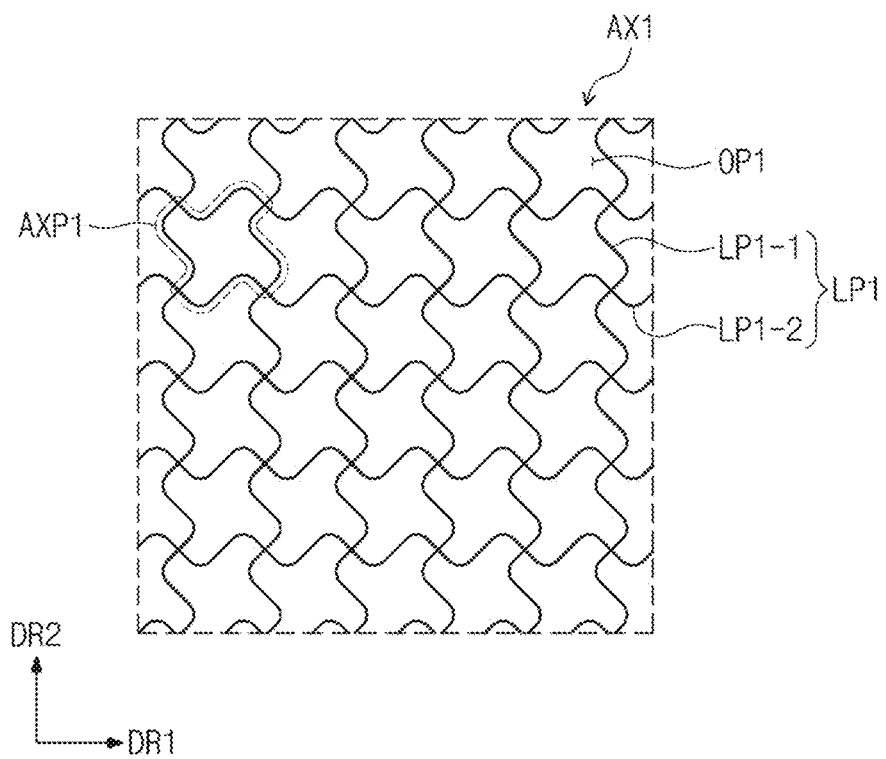
FIGS. 14A and 14B are plan views showing an embodiment of a first auxetic structure and a second auxetic structure according to the inventive concept.
Figure 14B:
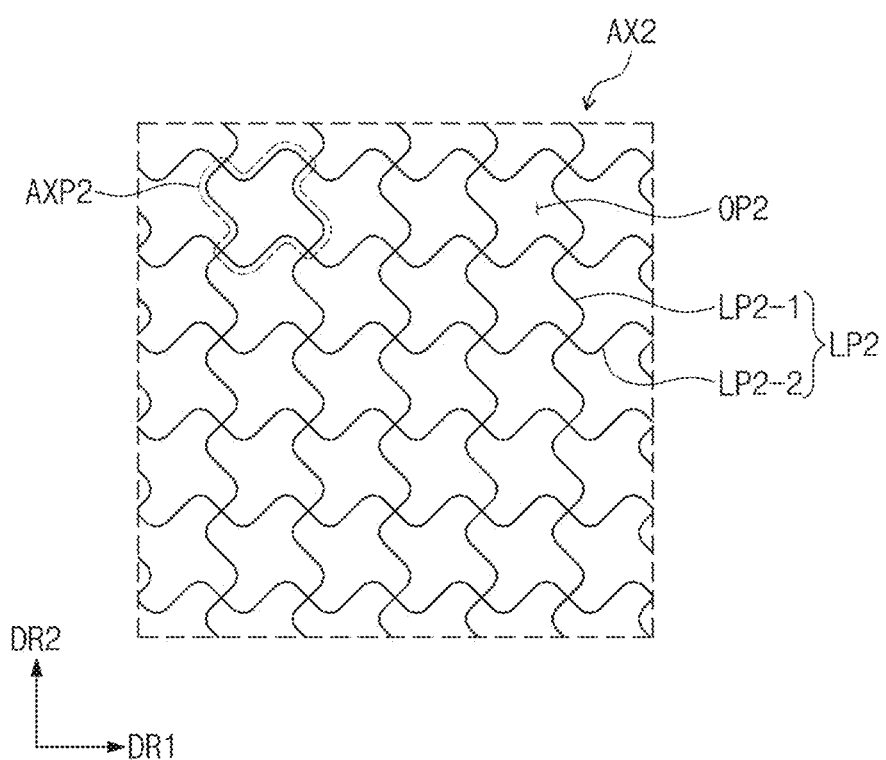
Figure 14C:
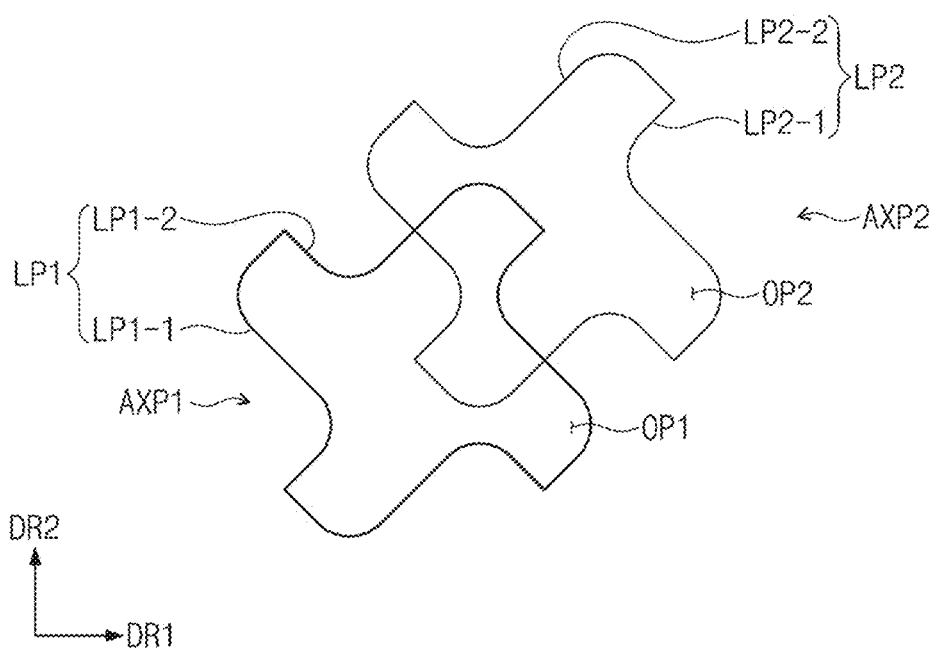
FIG. 14C is a plan view enlarging an embodiment of a first unit cell and a second unit cell which overlap according to the inventive concept.

FIGS. 14A and 14B are plan views showing an embodiment of a first auxetic structure AX1 and a second auxetic structure AX2 according to the inventive concept. FIG. 14C is a plan view enlarging an embodiment of a first unit cell AXP1 and a second unit cell AXP2 which overlap according to the inventive concept.

Referring to FIG. 14A, the first auxetic structure AX1 may include a first pattern LP1 having a negative Poisson's ratio and defining first openings OP1. The first auxetic structure AX1 may have a Poisson's ratio of about −0.5. The first pattern LP1 may include (1-1)-th components LP1-1 and (1-2)-th components LP1-2 extending in a different direction from the (1-1)-th components LP1-1.

The (1-1)-th components LP1-1 may be bent multiple times and may extend along the second direction DR2. The (1-2)-th components LP1-2 may be bent multiple times and may extend along the first direction DR1. Two adjacent (1-1)-th components LP1-1 in the first direction DR1 and two adjacent (1-2)-th components LP1-2 in the second direction DR2 may form one first unit cell AXP1.

Referring to FIG. 14B, the second auxetic structure AX2 may include a second pattern LP2 having a negative Poisson's ratio and defining second openings OP2. The second pattern LP2 may include (2-1)-th components LP2-1 and (2-2)-th components LP2-2 extending in a different direction from the (2-1)-th components LP2-1. The second pattern LP2 may be the same pattern as the first pattern LP1 of FIG. 14A except that the center of the second unit cell AXP2 and the center of the first unit cell AXP1 of FIG. 14A are displaced from each other.

Referring to FIG. 14C, shapes of the first unit cell AXP1 and the second unit cell AXP2 in a plan view when the first auxetic structure AX1 of FIG. 14A and the second auxetic structure AX2 overlap are shown.

The first pattern LP1 of the first auxetic structure AX1 may overlap the second openings OP2 of the second auxetic structure AX2 in a plan view. The second pattern LP2 of the second auxetic structure AX2 may overlap the first openings OP1 of the first auxetic structure AX1 in a plan view. That is, in a plan view, the first pattern LP1 may cover the second openings OP2 and the second pattern LP2 may cover the first openings OP1. Accordingly, when the first auxetic structure AX1 and the second auxetic structure AX2 overlap, the entirety of the first and second auxetic structures AX1 and AX2 may have a planar opening ratio of about 10% to about 60%.

Figure 15A:
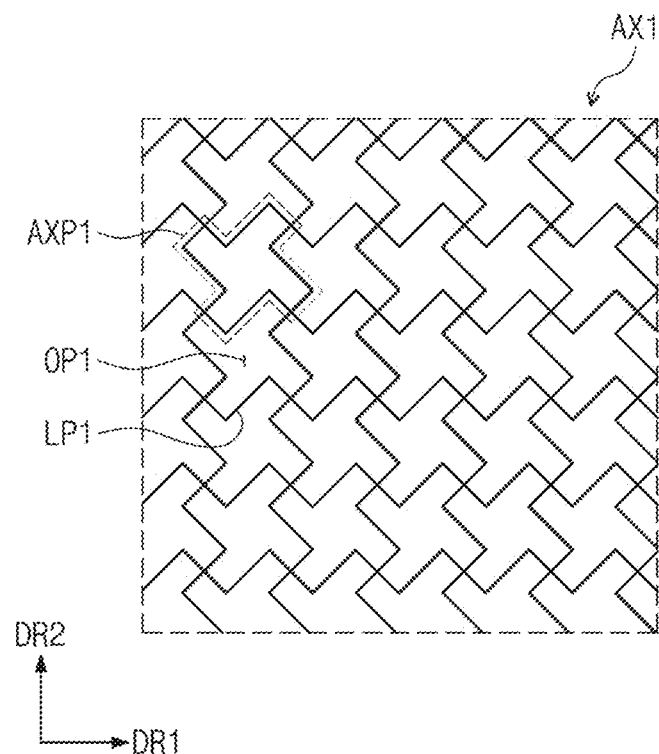
FIGS. 15A and 15B are plan views showing an embodiment of a first auxetic structure and a second auxetic structure according to the inventive concept.
Figure 15B:
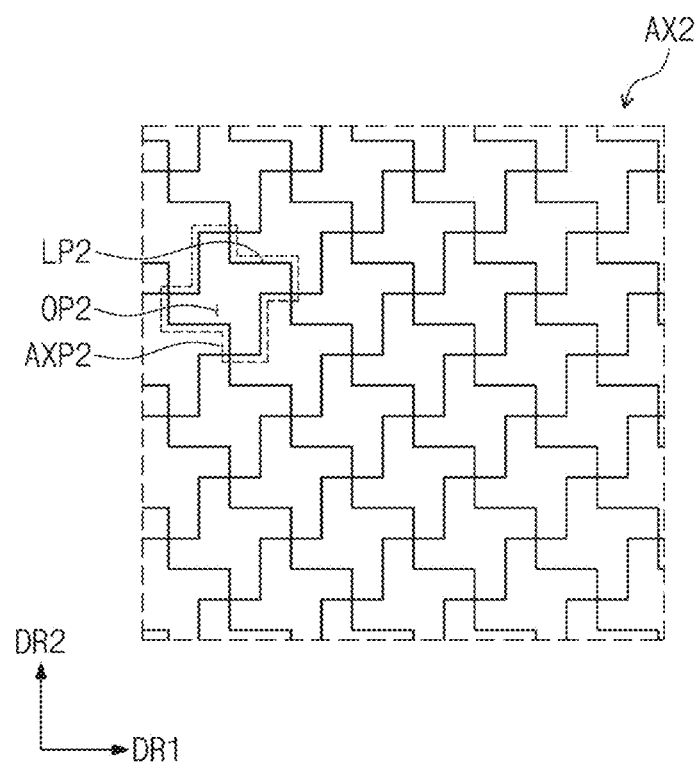
Figure 15C:
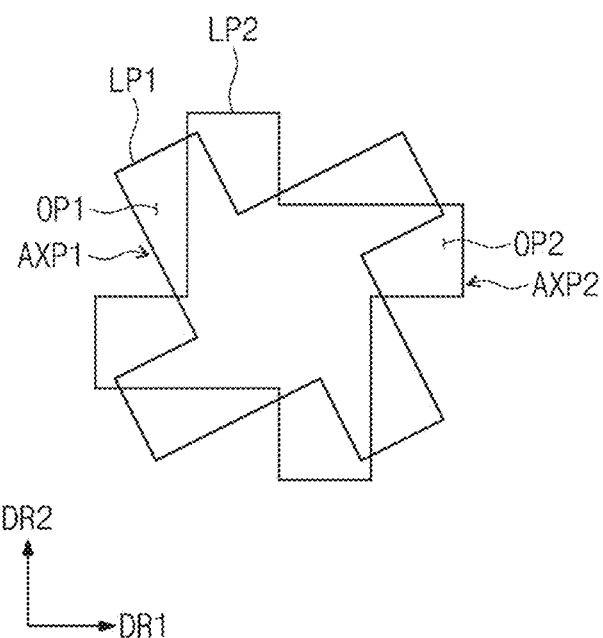
FIG. 15C is a plan view enlarging an embodiment of a first unit cell and a second unit cell which overlap according to the inventive concept.

FIGS. 15A and 15B are plan views showing an embodiment of a first auxetic structure AX1 and a second auxetic structure AX2 according to the inventive concept. FIG. 15C is a plan view enlarging an embodiment of a first unit cell AXP1 and a second unit cell AXP2 which overlap according to the inventive concept.

Referring to FIG. 15A, the first auxetic structure AX1 may include a first pattern LP1 having a negative Poisson's ratio and defining first openings OP1. The first pattern LP1 may define a first unit cell AXP1 that is bent multiple times and including four protrusions.

Referring to FIG. 15B, the second auxetic structure AX2 may include a second pattern LP2 having a negative Poisson's ratio and defining second openings OP2. The second pattern LP2 may be a pattern in which the first pattern LP1 of FIG. 15A is rotated 45 degrees in a plan view. However, herein the rotation angle in the plan view is not limited to 45 degrees and may be changed as desired.

Referring to FIG. 15C, shapes of the first unit cell AXP1 and the second unit cell AXP2 in a plan view when the first auxetic structure AX1 of FIG. 15A and the second auxetic structure AX2 of FIG. 15B overlap are shown.

The first pattern LP1 of the first auxetic structure AX1 may overlap the second openings OP2 of the second auxetic structure AX2 in a plan view. The second pattern LP2 of the second auxetic structure AX2 may overlap the first openings OP1 of the first auxetic structure AX1 in a plan view. That is, in a plan view, the first pattern LP1 may cover the second openings OP2 and the second pattern LP2 may cover the first openings OP1. Accordingly, when the first auxetic structure AX1 and the second auxetic structure AX2 overlap, the entirety of the first and second auxetic structures AX1 and AX2 may have a planar opening ratio of about 10% to about 60%.

Figure 16:
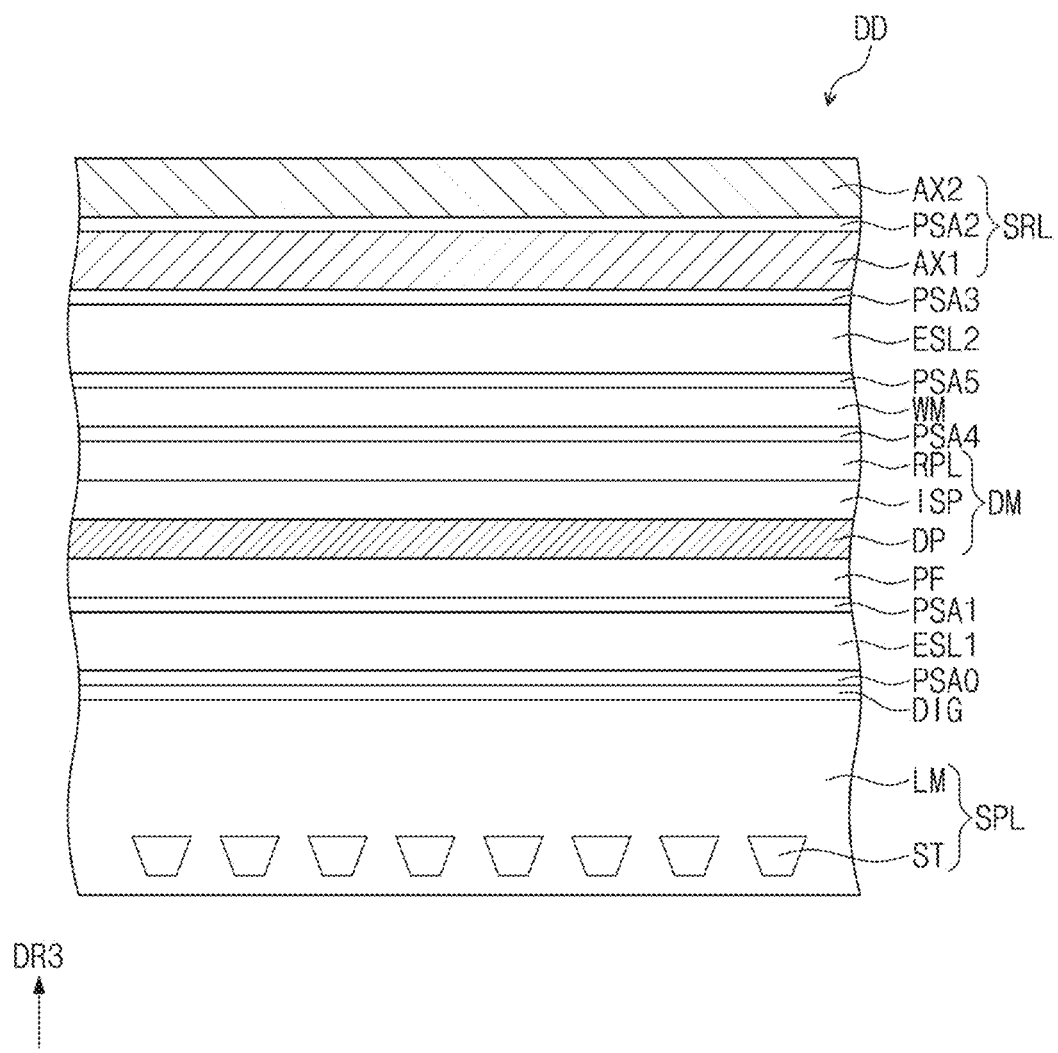
FIG. 16 is a cross-sectional view of an embodiment of a display device according to the inventive concept.

FIG. 16 is a cross-sectional view of an embodiment of a display device DD according to the inventive concept.

The display device DD shown in FIG. 16 is the same as the display device DD shown in FIG. 3 except for the position of the stress control layer SRL, and thus descriptions of the same components are omitted.

The stress control layer SRL may be disposed on an upper surface of the display panel DP. In this case, the stress control layer SRL is disposed in a passage through which light emitted from the display panel DP goes out. Accordingly, the stress control layer SRL may include a material having a light transmittance of about 90% or greater to prevent the stress control layer SRL from reflecting or distorting light of the display panel DP. That is, the first auxetic structure AX1, the second adhesive layer PSA2, and the second auxetic structure AX2 may all include or consist of a material having a light transmittance of about 90% or greater.

Metals such as steel use stainless ("SUS") are mainly used as the first and second auxetic structures AX1 and AX2, but materials such as plastic may be used to increase the light transmittance of the first and second auxetic structures AX1 and AX2. In an embodiment, polyethylene terephthalate ("PET"), polycarbonate ("PC"), polyimide ("PI"), or the like having a light transmittance of about 90% or greater as the first auxetic structure AX1 and the second auxetic structure AX2 may be used, for example. An optically clear resin ("OCR") or an optically clear adhesive ("OCA") having a light transmittance of about 90% or greater may be used as the second adhesive layer PSA2. However, the materials of the first auxetic structure AX1, the second auxetic structure AX2, and the second adhesive layer PSA2 are not limited thereto, and various materials having a light transmittance of about 90% or greater may be used.

Figure 17:
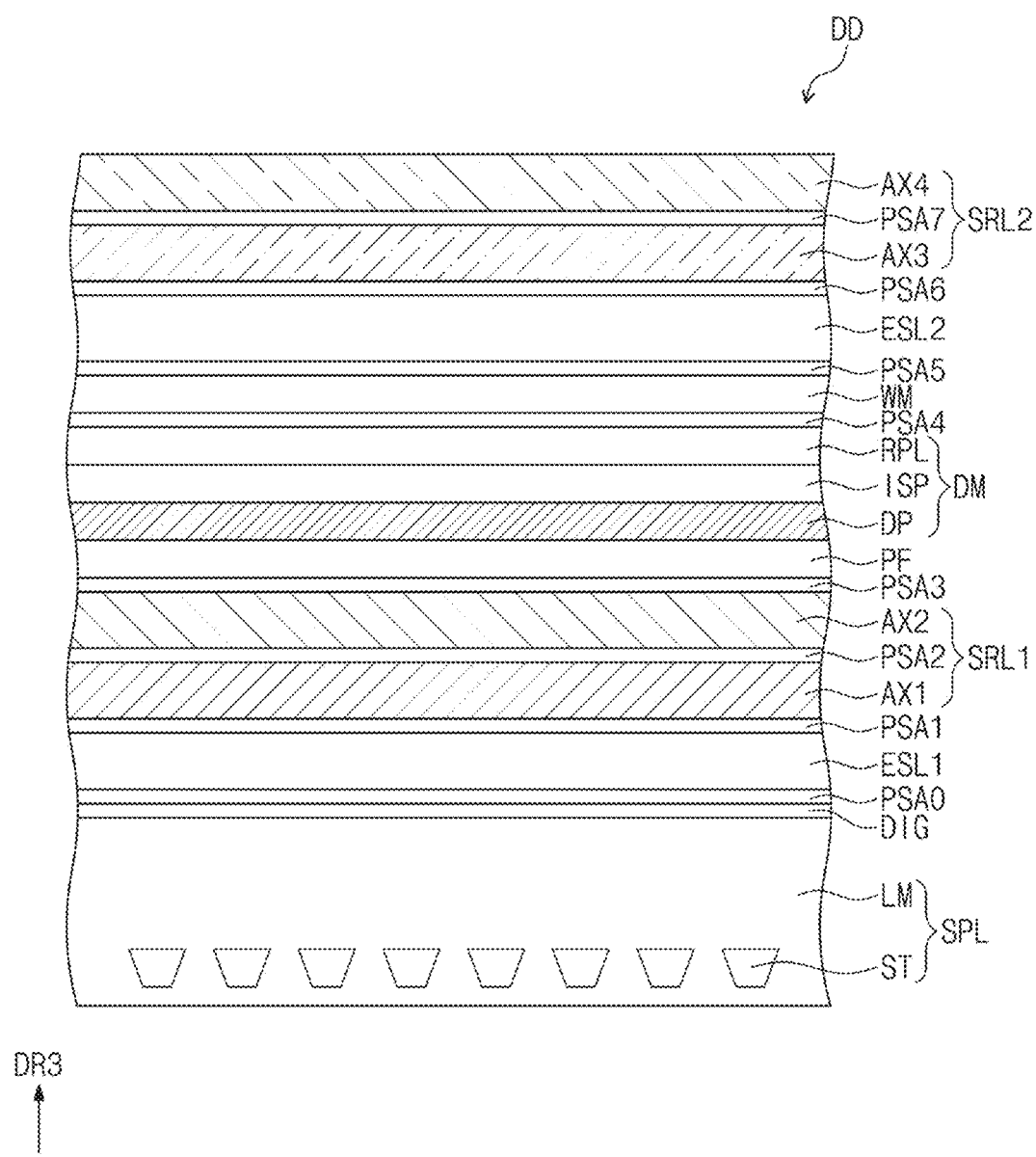
FIG. 17 is a cross-sectional view of an embodiment of a display device according to the inventive concept.

FIG. 17 is a cross-sectional view of an embodiment of a display device DD according to the inventive concept.

Referring to FIG. 17, the display device DD of FIG. 17 is the same as the display device DD shown in FIG. 16 except for having a plurality of stress control layers SRL1 and SRL2, and thus descriptions of the same components are omitted.

The first stress control layer SRL1 may be disposed on a lower surface of the display panel DP. That is, the first auxetic structure AX1, the second adhesive layer PSA2, and the second auxetic structure AX2 may be disposed between the display panel DP and the support layer SPL.

The first auxetic structure AX1, the second adhesive layer PSA2, and the second auxetic structure AX2 may include a non-magnetic material that is not responsive to a magnetic field. The first auxetic structure AX1, the second adhesive layer PSA2, and the second auxetic structure AX2 include or consist of a non-magnetic material, and may thus not disturb the operation of a digitizer DIG that recognizes user inputs using a magnetic field.

The second stress control layer SRL2 may include a third auxetic structure AX3, a seventh adhesive layer PSA7, and a fourth auxetic structure AX4. The second stress control layer SRL2 may be disposed on an upper surface of the display panel DP. The third auxetic structure AX3, the seventh adhesive layer PSA7, and the fourth auxetic structure AX4 may be disposed on an upper side of the window WM to serve as a protection layer for the window WM.

The second stress control layer SRL2 may be disposed on an upper surface of the display panel DP. In this case, the second stress control layer SRL2 is disposed in a passage through which light emitted from the display panel DP goes out. Accordingly, the second stress control layer SRL2 may include a material having a light transmittance of about 90% or greater to prevent the second stress control layer SRL2 from reflecting or distorting light of the display panel DP. That is, the third auxetic structure AX3, the seventh adhesive layer PSA7, and the fourth auxetic structure AX4 may all include or consist of a material having a light transmittance of about 90% or greater, for example.

Metals such as steel use stainless (SUS) are mainly used as the auxetic structures AX3 and AX4, but materials such as plastic may be used to increase the light transmittance of the auxetic structures AX3 and AX4. In an embodiment, polyethylene terephthalate ("PET"), polycarbonate ("PC"), polyimide ("PI"), or the like having a light transmittance of about 90% or greater as the third auxetic structure AX3 and the fourth auxetic structure AX4 may be used. An optically clear resin ("OCR") or an optically clear adhesive ("OCA") having a light transmittance of about 90% or greater may be used as the seventh adhesive layer PSA7. However, the materials of the third auxetic structure AX3, the fourth auxetic structure AX4, and the seventh adhesive layer PSA7 are not limited thereto, and various materials having a light transmittance of about 90% or greater may be used.

Figure 18:
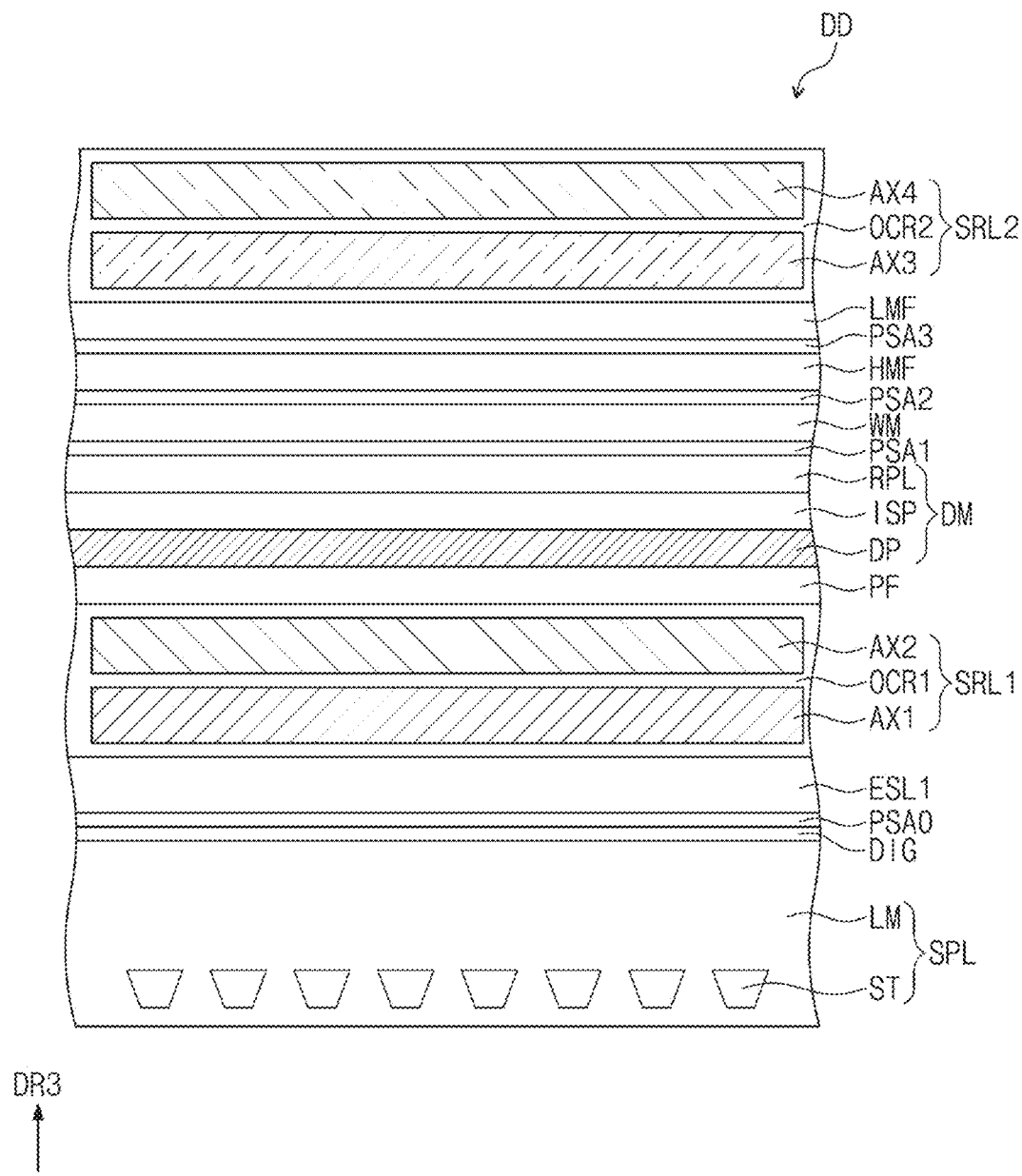
FIG. 18 is a cross-sectional view of an embodiment of a display device according to the inventive concept.

FIG. 18 is a cross-sectional view of an embodiment of a display device DD according to the inventive concept.

The display device DD of FIG. 18 is the same as the display device DD of FIG. 17 except for the first stress control layer SRL1, the second stress control layer SRL2, the first protection layer HMF and the second protection layer LMF, descriptions of the same components are omitted.

The first stress control layer SRL1 may include the first auxetic structure AX1, the second auxetic structure AX2, and a first optical adhesive layer OCR1. The first stress control layer SRL1 may be disposed below the display panel DP. The first auxetic structure AX1 and the second auxetic structure AX2 may be impregnated into the first optical adhesive layer OCR1. The first auxetic structure AX1 and the second auxetic structure AX2 may be spaced apart at regular intervals and disposed inside the first optical adhesive layer OCR1. The first optical adhesive layer OCR1 may surround all surfaces of the first auxetic structure AX1 and the second auxetic structure AX2.

The first stress control layer SRL1 may include a non-magnetic material that is not responsive to a magnetic field. The first magnetic structure AX1, the second auxetic structure AX2, and the first optical adhesive layer OCR1 are all including or consisting of non-magnetic materials, and may thus not disturb the operation of a digitizer DIG that senses user inputs using a magnetic field.

The first optical adhesive layer OCR1 may be an optical adhesive material having improved impact resistance. The first optical adhesive layer OCR1 may be formed using an optically clear resin ("OCR"), which is in the form of atypical liquid. As for the first optical adhesive layer OCR1, adhesive materials such as acrylic, silicone-based, or urethane-based adhesive materials may be used. However, the first optical adhesive layer OCR1 is not limited thereto, and adhesive materials having various shapes and components may be used.

A refractive index of the first optical adhesive layer OCR1 may be substantially the same as refractive indices of the first auxetic structure AX1 and the second auxetic structure AX2.

The first auxetic structure AX1 and the second auxetic structure AX2 are impregnated into the first optical adhesive layer OCR1, and accordingly, when rolling and unrolling of the display device DD are repeated, the first auxetic structure AX1 and the second auxetic structure AX2 may be prevented from being deformed or peeled off. Accordingly, degradation of surface quality of the display device DD may be prevented.

The second stress control layer SRL2 may include the third auxetic structure AX3, the fourth auxetic structure AX4, and a second optical adhesive layer OCR2. The second stress control layer SRL2 is the same as the first stress control layer SRL1, except that the second stress control layer SRL2 is disposed above the display panel DP. However, the second stress control layer SRL2 is a passage through which light emitted from the display panel DP moves, and the third auxetic structure AX3, the fourth auxetic structure AX4, and the second optical adhesive layer OCR2 may thus have a light transmittance of about 90% or greater.

The first protection layer HMF may be disposed on an upper surface of the display panel DP. The first protection layer HMF is disposed close to the display panel DP adjacent to the neutral plane, cracks may be less likely caused even when the modulus is large. The first protection layer HMF may have a modulus of about 1 Gpa to about 10 Gpa. The first protection layer HMF may have a thickness of about 10 μm to about 100 μm. The first protection layer HMF may protect the display panel DP from external shocks when the display device DD is rolled.

The second protection layer LMF may be disposed on an upper surface of the first protection layer HMF. The second protection layer LMF is disposed far from the display panel DP adjacent to the neutral plane, cracks may be more likely caused when the modulus is large. The second protection layer LMF may have a modulus of about 1 Mpa to about 1 Gpa. The second protection layer LMF may serves energy damping when external shocks are applied to the display device DD. That is, the second protection layer LMF may reduce impact energy applied to the display device DD.

FIGS. 19A to 19D are cross-sectional views of display devices according to Comparative Examples and an embodiment of the inventive concept.

Figure 19A:
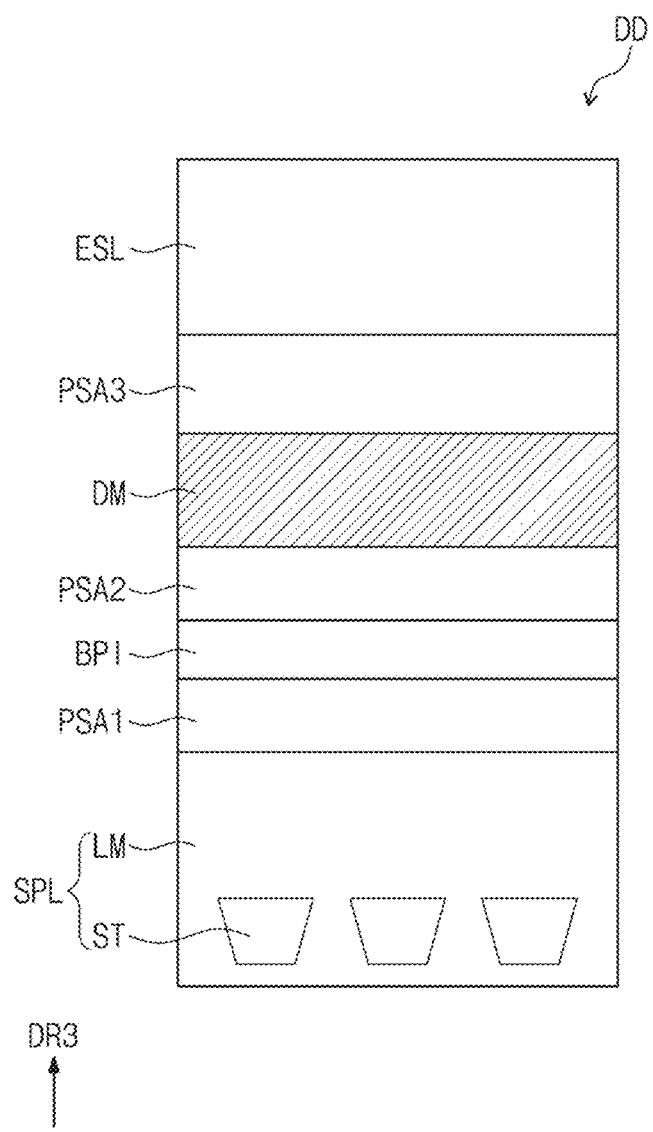
FIGS. 19A to 19D are cross-sectional views of display devices according to Comparative Examples and Embodiments of the inventive concept.
Figure 19B:
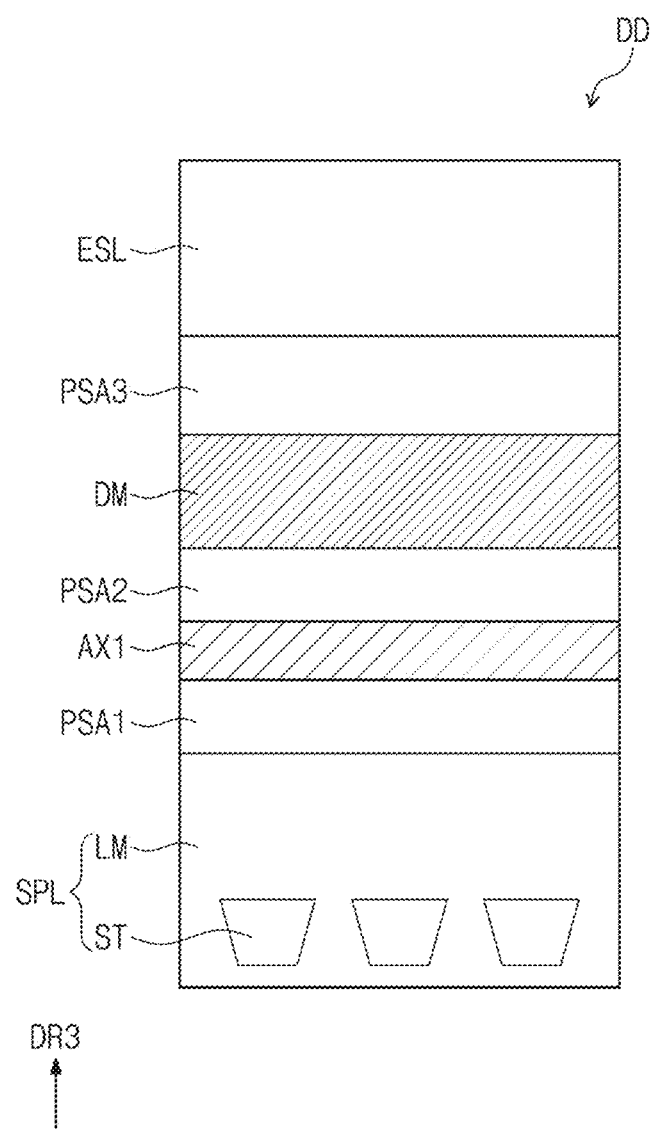
Figure 19C:
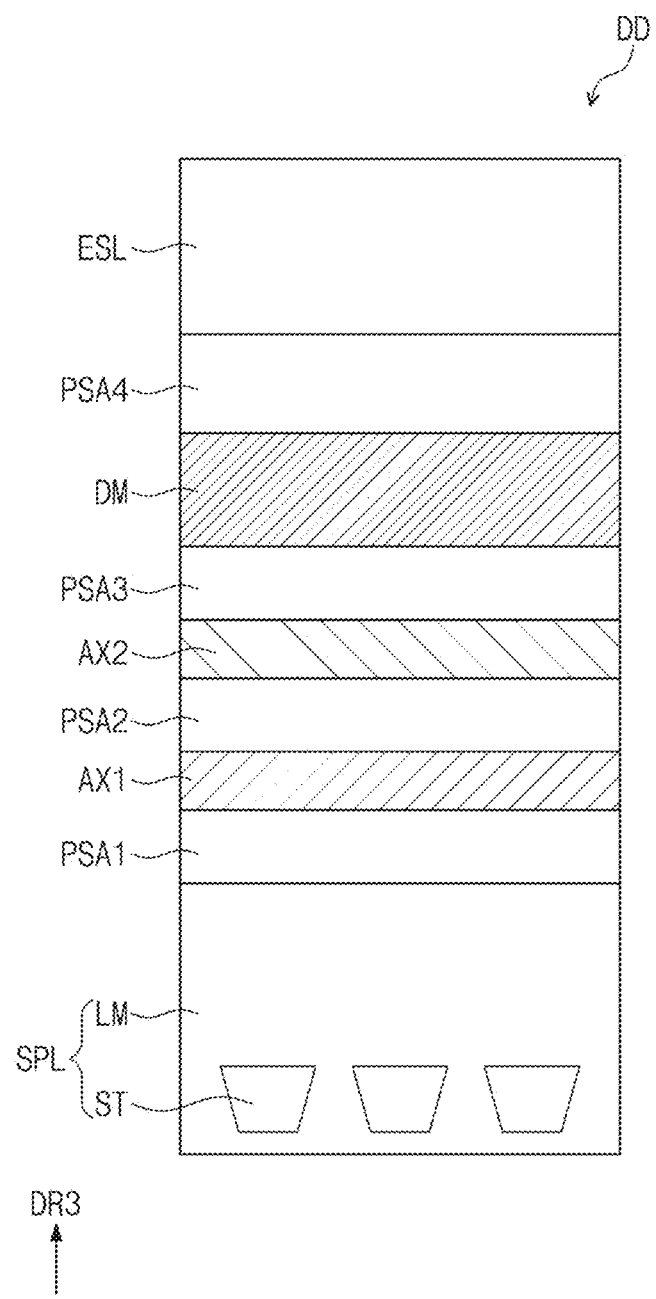
Figure 19D:
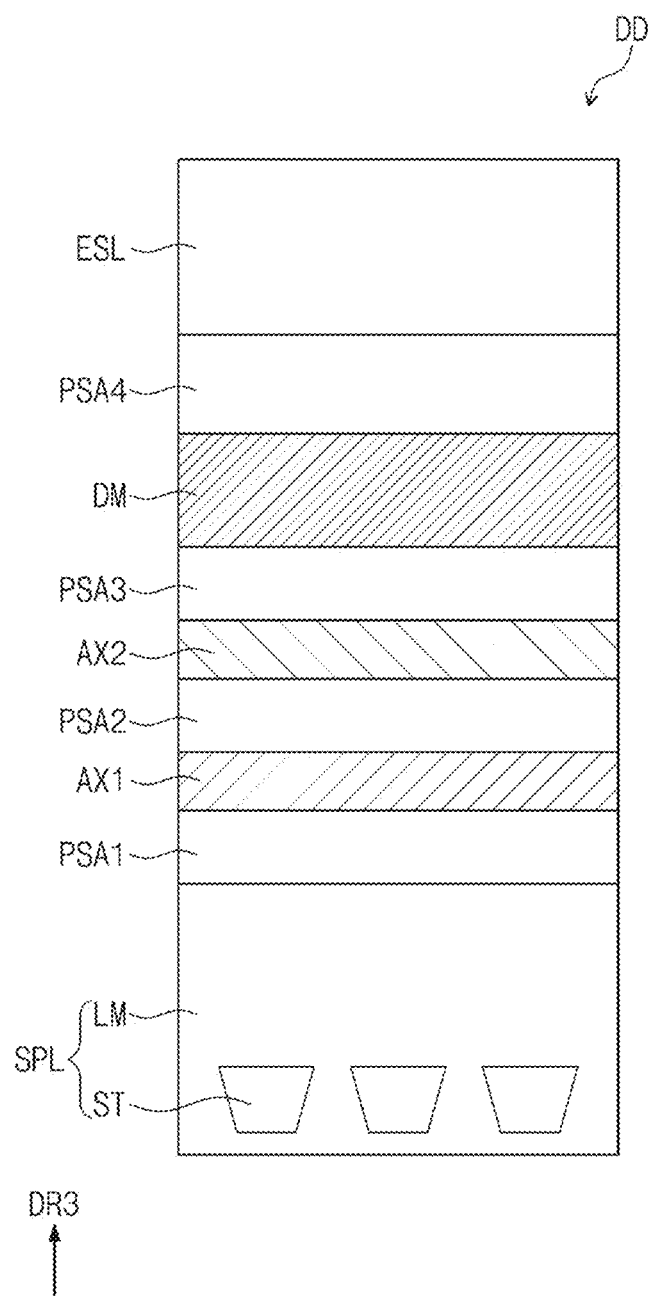

FIG. 19A is a cross-sectional view of a display device DD of Comparative Example 1. FIG. 19B is a cross-sectional view of a display device DD of Comparative Example 2. FIG. 19C is a cross-sectional view of a display device DD according to Embodiment 3 of the inventive concept. Each of the first auxetic structure AX1 and the second auxetic structure AX2 of Embodiment 3 is the same as the first auxetic structure AX1 and the second auxetic structure AX2 of FIG. 11. FIG. 19D is a cross-sectional view of a display device DD according to Embodiment 4 of the inventive concept. Each of the first auxetic structure AX1 and the second auxetic structure AX2 of Embodiment 4 is the same as the first auxetic structure AX1 and the second auxetic structure AX2 of FIG. 8.

Pen-drop tests and rollability tests were performed on the display devices DD of Comparative Examples 1 and 2 and Embodiments 3 and 4. In the pen drop tests, a minimum height at which bright spots are not caused was determined by dropping a pen on the display surface of a display device DD in a dark mode, which is placed on a pedestal. In the rollability tests, a radius of curvature of the display device DD was determined when the display device DD was unfolded after being stored for 240 hours in a rolled state at 60° C. and a relative humidity of 93%. The test results are shown in Table 2 below.

TABLE 2

|  | Comparative Example 1 | Comparative Example 2 | Embodiment 3 | Embodiment 4 |
| --- | --- | --- | --- | --- |
| Pen drop | 6 cm | 4 cm | 6 cm | 8 cm |
| Rollability | 1.5 cm | 2 cm | 2.5 cm | 2.5 cm |

As shown in Table 2, it is seen that the display devices DD of Embodiments 3 and 4 exhibit the same or better pen drop results as/than the pen drop results of Comparative Examples 1 and 2, respectively, to have excellent shock resistance. In addition, it is seen that the display device DD of Embodiments 3 and 4 exhibit the largest curvature radius of about 2.5 centimeter (cm), and thus the restoration after rolling of the display device DD works best. Therefore, it is seen that as in Embodiment 4, when the stress control layer SRL has a double structure of the first and second auxetic structures AX1 and AX2, and the first auxetic structure AX1 and the second auxetic structure AX2 overlap, both impact resistance and rollability may be secured when an opening ratio is reduced (refer to FIG. 8).

In an embodiment of the inventive concept, a first auxetic structure and a second auxetic structure overlap, and may thus reduce stress on mechanical deformation such as repetitive rolling or folding.

In addition, rollability and impact resistance may be secured by arranging a planar pattern defined by a first pattern and a second pattern to have a relatively small opening ratio.

Although the disclosure has been described with reference to a preferred embodiment of the inventive concept, it will be understood that the inventive concept should not be limited to these preferred embodiments but various changes and modifications may be made by those skilled in the art without departing from the spirit and scope of the disclosure. Hence, the technical scope of the disclosure is not limited to the detailed descriptions in the specification but should be determined only with reference to the claims.

What is claimed is:
1. A display device comprising:
    a display panel;
    a first auxetic structure including a first pattern which defines a plurality of first openings, overlapping the display panel, and having a negative Poisson's ratio;
    a second auxetic structure including a second pattern which defines a plurality of second openings, overlapping the first auxetic structure, and having a negative Poisson's ratio; and
    a support layer disposed below the display panel and supporting the display panel.
2. The display device of claim 1, further comprising:
    an adhesive layer disposed between the first auxetic structure and the second auxetic structure and bonding the first auxetic structure and the second auxetic structure,
    wherein the adhesive layer has a smaller modulus than a modulus of the first auxetic structure and the second auxetic structure.

3. The display device of claim 1, wherein the display panel provides a display surface defined by a first direction and a second direction, and
in a first mode of the display device, the display surface provides a flat surface, and in a second mode of the display device, at least a portion of the display surface provides a curved surface with respect to a reference axis.

4. The display device of claim 3, wherein the support layer comprises a plurality of support sticks parallel to the reference axis, and
in the first mode, the plurality of support sticks are arranged along a direction crossing the reference axis.

5. The display device of claim 1, wherein the first auxetic structure and the second auxetic structure each have a Poisson's ratio of equal to or greater than about −0.9 and equal to or less than about −0.1.

6. The display device of claim 1, wherein the first pattern overlaps the second pattern, and the first pattern and the second pattern are identical to each other.

7. The display device of claim 1, wherein when the first pattern and the second pattern overlap, an opening ratio of a planar pattern defined by the first pattern and the second pattern is equal to or greater than about 10% and equal to or less than about 60%.

8. The display device of claim 1, wherein the first pattern overlaps the second pattern, and the second pattern is a pattern in which the first pattern is rotated equal to or greater than about 45 degrees and equal to or less than about 180 degrees in a plan view.

9. The display device of claim 1, wherein the first auxetic structure has a thickness of equal to or greater than about 10 micrometers and equal to or less than about 500 micrometers, and
the second auxetic structure has a thickness of equal to or greater than about 10 micrometers and equal to or less than about 500 micrometers.

10. The display device of claim 1, wherein the first auxetic structure and the second auxetic structure each are disposed between the display panel and the support layer.

11. The display device of claim 1, further comprising a digitizer disposed below the display panel,
wherein the first auxetic structure and the second auxetic structure each are disposed below the display panel, and include a non-magnetic material which is not responsive to a magnetic field.

12. The display device of claim 1, wherein the first auxetic structure and the second auxetic structure each are disposed on an upper surface of the display panel.

13. The display device of claim 12, wherein the first auxetic structure and the second auxetic structure each comprise a material having a light transmittance of equal to or greater than about 90%.

14. The display device of claim 1, further comprising an optical adhesive layer,
wherein the first auxetic structure and the second auxetic structure are impregnated into the optical adhesive layer.

15. The display device of claim 14, wherein a refractive index of the optical adhesive layer, a refractive index of the first auxetic structure, and a refractive index of the second auxetic structure are substantially identical to each other.

16. The display device of claim 1, further comprising a display panel protection layer disposed on a lower surface of the display panel and having a modulus of equal to or greater than about 1 gigapascal and equal to or less than about 10 gigapascals.

17. The display device of claim 1, further comprising an elastic layer disposed on the support layer or disposed on the display panel and including an elastomer.

18. A display device comprising:
a display panel;
a plurality of stress control layers overlapping the display panel, the plurality of stress control layers including:
a first stress control layer disposed on an upper surface of the display panel and a second stress control layer disposed on a lower surface of the display panel, each of the first stress control layer and the second stress control layer including:
a first auxetic structure including a first pattern which defines a plurality of first openings and having a negative Poisson's ratio; and
a second auxetic structure overlapping the first auxetic structure, including a second pattern which defines a plurality of second openings, and having a negative Poisson's ratio; and
a support layer disposed below the plurality of stress control layers and supporting the display panel.

19. The display device of claim 18, wherein the first auxetic structure and the second auxetic structure each have a Poisson's ratio of equal to or greater than about −0.9 and equal to or less than about −0.1.

20. The display device of claim 18, wherein the first stress control layer comprises a material having a light transmittance of equal to or greater than about 90%, and
the second stress control layer comprises a non-magnetic material which is not responsive to a magnetic field.

21. The display device of claim 18, wherein the first pattern overlaps the plurality of second openings in a plan view and the second pattern overlaps the plurality of first openings in the plan view, and
when the first pattern and the second pattern overlap, a planar opening ratio of an entirety of the first and second auxetic structures is equal to or greater than about 10% and equal to or less than about 60%.

* * * * *